(12) United States Patent
Garlapati et al.

(10) Patent No.: US 7,405,601 B2
(45) Date of Patent: Jul. 29, 2008

(54) HIGH-SPEED DIVIDER WITH PULSE-WIDTH CONTROL

(75) Inventors: Akhil K. Garlapati, Woburn, MA (US); Lizhong Sun, Nashua, NH (US); Douglas F. Pastorello, Hudson, NH (US); Richard J. Juhn, Nashua, NH (US); Axel Thomsen, Austin, TX (US)

(73) Assignee: Silicon Laboratories Inc., Austin, TX (US)

(*) Notice: Subject to any disclaimer, the term of this patent is extended or adjusted under 35 U.S.C. 154(b) by 0 days.

(21) Appl. No.: 11/680,026

(22) Filed: Feb. 28, 2007

(65) Prior Publication Data

US 2007/0139088 A1  Jun. 21, 2007

Related U.S. Application Data

(63) Continuation-in-part of application No. 10/878,198, filed on Jun. 28, 2004, now Pat. No. 7,187,216.

(60) Provisional application No. 60/567,479, filed on May 3, 2004.

(51) Int. Cl.
*H03K 21/00* (2006.01)
(52) U.S. Cl. ........................ 327/115; 327/117
(58) Field of Classification Search ........................ None
See application file for complete search history.

(56) References Cited

U.S. PATENT DOCUMENTS

| | | | |
|---|---|---|---|
| 3,813,610 A | 5/1974 | Kimura | |
| 5,425,074 A | 6/1995 | Wong | |
| 5,781,054 A | 7/1998 | Lee | |
| 6,061,418 A | 5/2000 | Hassoun | |
| 6,310,507 B1 * | 10/2001 | Takeuchi et al. | 327/291 |
| 6,404,291 B1 * | 6/2002 | Riley | 331/11 |
| 6,617,893 B1 | 9/2003 | Born et al. | |
| 6,618,462 B1 | 9/2003 | Ross et al. | |
| 6,683,932 B1 | 1/2004 | Wood | |
| 6,807,552 B2 | 10/2004 | Bredin et al. | |
| 6,930,519 B2 | 8/2005 | Fallahi et al. | |
| 6,952,125 B2 | 10/2005 | Ahn et al. | |

(Continued)

OTHER PUBLICATIONS

Craninckx, Jan and Steyaert, Michiel S. J., "A 1.75-GHz/3-V Dual-Modulus Divide-by-128/129 Prescaler in 0.7-μm CMOS," IEEE Journal of Solid-State Circuits, vol. 31, No. 7, Jul. 1996, pp. 890-897.

(Continued)

*Primary Examiner*—Cassandra Cox
(74) *Attorney, Agent, or Firm*—Zagorin O'Brien Graham LLP

(57) ABSTRACT

In at least one embodiment of the invention, a method for dividing a first signal having a first frequency by a divide ratio to generate a lower frequency signal includes generating a first plurality of signals having a common frequency, a first pulse width, and different phases. The first plurality of signals is based, at least in part, on at least one signal having a second pulse width. The first pulse width is selected from a plurality of pulse widths based, at least in part, on the divide ratio. The method includes sequentially selecting individual pulses of the first plurality of signals as an output signal of a select circuit to generate an output signal having a frequency lower than the first frequency.

29 Claims, 32 Drawing Sheets

U.S. PATENT DOCUMENTS

| | | | |
|---|---|---|---|
| 6,970,025 | B2 | 11/2005 | Magoon et al. |
| 7,113,009 | B2 | 9/2006 | Sun et al. |
| 7,123,101 | B2 * | 10/2006 | Puma et al. .................... 331/16 |
| 7,129,789 | B2 * | 10/2006 | Hsiao et al. ................. 331/1 A |
| 7,187,216 | B2 | 3/2007 | Sun et al. |
| 2005/0212570 | A1 | 9/2005 | Sun et al. |
| 2005/0242848 | A1 | 11/2005 | Sun et al. |

OTHER PUBLICATIONS

Krishnapura, Nagendra and Kinget, Peter R., "A 5.3-GHz Programmable Divider for HiPerLAN in 0.25-µm CMOS," IEEE Journal of Solid-State Circuits, vol. 35, No. 7, Jul. 2000, pp. 1019-1024.

Perrott, Michael Henderson, "Techniques for High Data Rate Modulation and Low Power Operation of Fractional-N Frequency Synthesizers," Dissertation, Massachusetts Institute of Technology, Sep. 1997, pp. 1-199.

* cited by examiner

| divSel | R (mod 8) | R' (effective R) | Division Factor |
|---|---|---|---|
| - | 1 | 1 | 0.5 |
| - | 2 | 2 | 1.0 |
| - | 3 | 3 | 1.5 |
| 0 | 4 | 4 | 2.0 |
| 1 | 5 | 5 | 2.5 |
| 2 | 6 | 6 | 3.0 |
| 3 | 7 | 7 | 3.5 |
| 4 | 0 | 8 | 4.0 |
| 5 | 1 | 9 | 4.5 |
| 6 | 2 | 10 | 5.0 |
| 7 | 3 | 11 | 5.5 |

FIG. 6

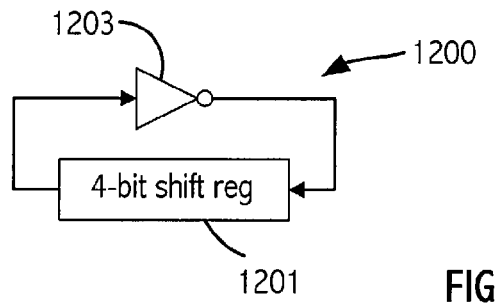
FIG. 12A
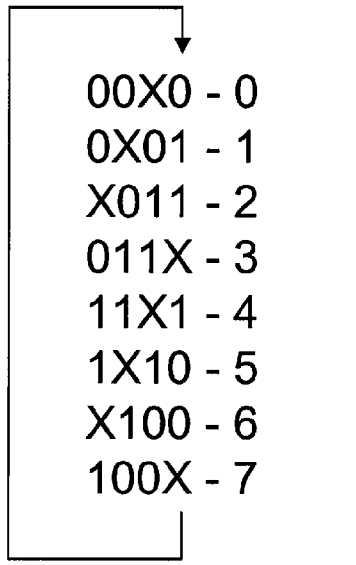
FIG. 12B
+0 {d, c, b, a}
+1   {c, b, a, ~d}
+2     {b, a, ~d, ~c}
+3       {a, ~d, ~c, ~b}
+4         {~d, ~c, ~b, ~a}
+5           {~c, ~b, ~a, d}
+6             {~b, ~a, d, c}
+7               {~a, d, c, b}
FIG. 12C

| M' | Q | R | output freq |
|----|---|----|-------------|
| 5  | 1 | -3 | 500M |
| 6  | 1 | -2 | 416M |
| 7  | 1 | -1 | 357M |
| 8  | 1 | 0  | 312M |
| 9  | 1 | 1  | ⋮ |
| 10 | 1 | 2  |  |
| 11 | 1 | 3  |  |
| 12 | 1 | 4  |  |
| 13 | 2 | -3 |  |
| 14 | 2 | -2 |  |
| 15 | 2 | -1 |  |
| 16 | 2 | 0  |  |
| ⋮  | ⋮ | ⋮  |  |
| 287 | 36 | -1 | 8.71M |
M'=80+R
FIG. 16
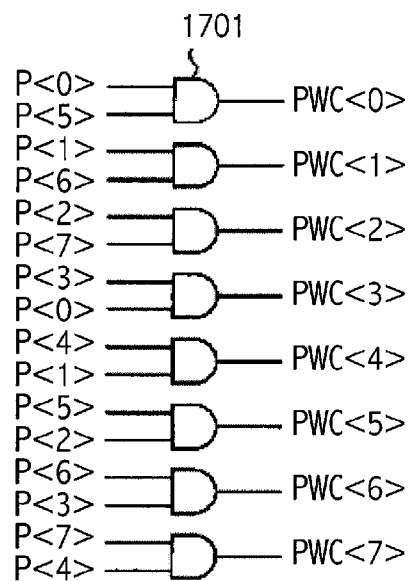
FIG. 17C
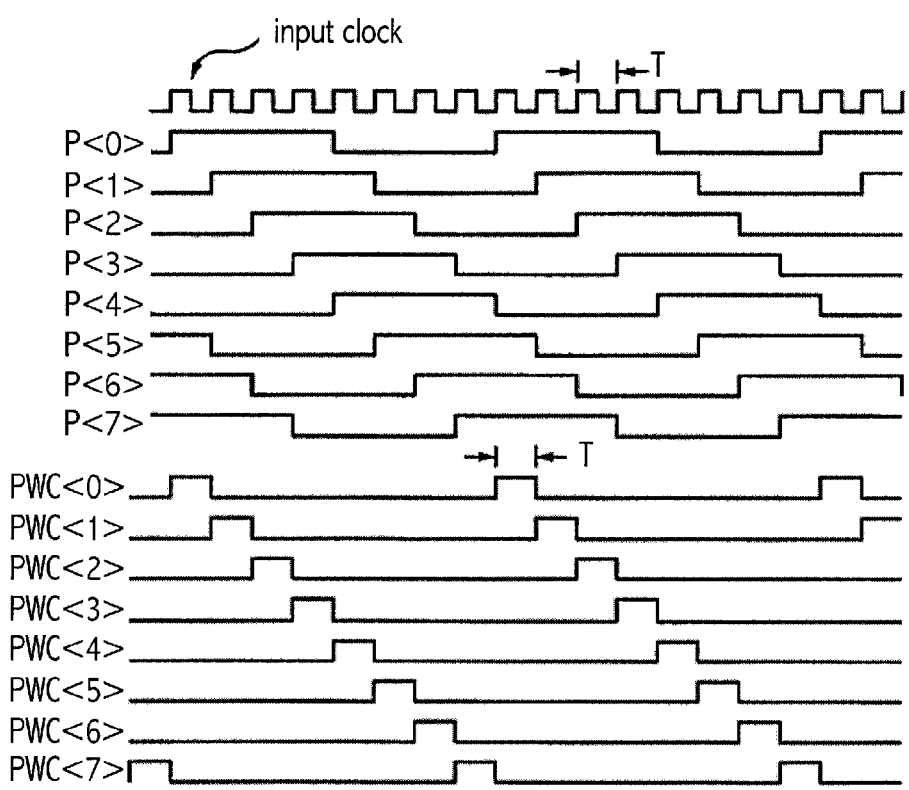
FIG. 17A
FIG. 17B

|        | 400ps   | 800ps |
|--------|---------|-------|
| ph(0)  | p0⊕p2   | p0    |
| ph(1)  | p1⊕p3   | p1    |
| ph(2)  | p2⊕p0b  | p2    |
| ph(3)  | p3⊕p0b  | p3    |
| ph(4)  | p0b⊕p2b | p0b   |
| ph(5)  | p1b⊕p3b | p1b   |
| ph(6)  | p2b⊕p0  | p2b   |
| ph(7)  | p3b⊕p1  | p3b   |
FIG. 34
| DIVIDE RATIO | m(2:0) |
|--------------|--------|
| 4            | 100    |
| 5            | 101    |
| 6            | 110    |
| 7            | 111    |
| 8            | 000    |
| 9            | 001    |
| 10           | 010    |
| 11           | 011    |
FIG. 37
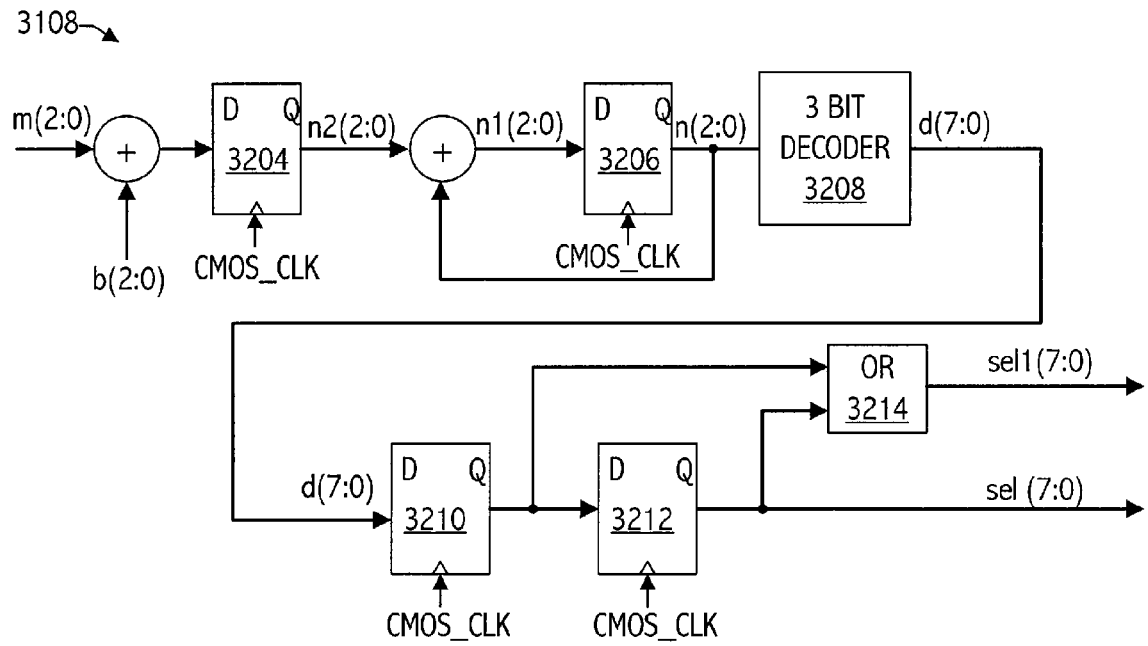
FIG. 36
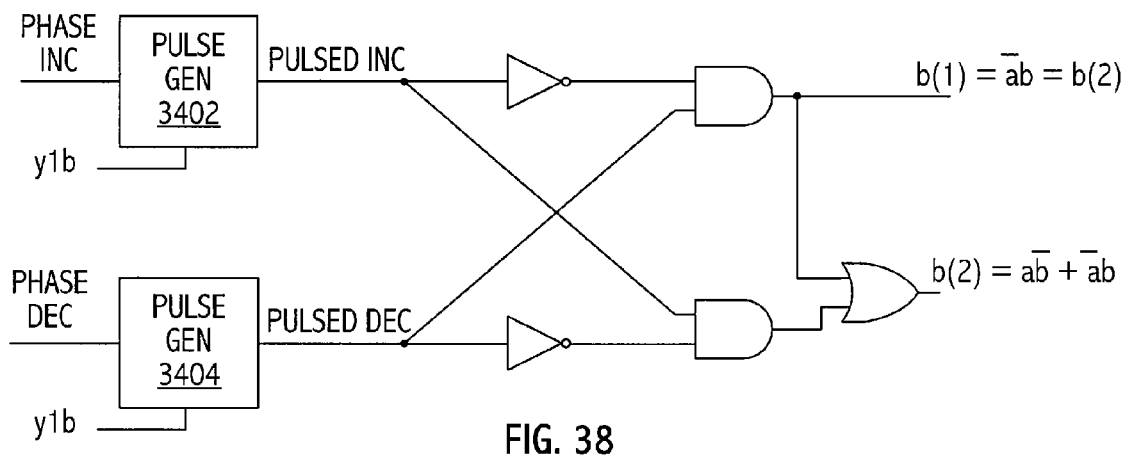
FIG. 38

| DIVIDE RATIO | PULSE WIDTH | PERIOD | CORRECTION FOR 50% DUTY CYCLE |
|---|---|---|---|
| 4 | 400 ps | 800 ps | 0 ps |
| 5 | 400 ps | 1.0ns | 100 ps |
| 6 | 400 ps | 1.2ns | 200 ps |
| 7 | 400 ps | 1.4ns | 300 ps |
| 8 | 800 ps | 1.6ns | 0 ps |
| 9 | 800 ps | 1.8ns | 100 ps |
| 10 | 800 ps | 2.0ns | 200 ps |
| 11 | 800 ps | 2.2ns | 300 ps |

HIGH-SPEED DIVIDER WITH PULSE-WIDTH CONTROL

CROSS-REFERENCE TO RELATED APPLICATION(S)

This application is a continuation-in-part of U.S. patent application Ser. No. 10/878,198 naming Lizhong Sun, Douglas F. Pastorello, Richard J. Juhn, and Axel Thomsen as inventors, entitled "PHASE SELECTABLE DIVIDER CIRCUIT," filed Jun. 28, 2004, now U.S. Pat. No. 7,187,216 which claims benefit to a provisional application 60/567,479, under 35 U.S.C. § 119(e), naming Axel Thomsen et al., as inventors, entitled "METHOD AND APPARATUS FOR A PROGRAMMABLE CLOCK SOURCE GENERATING A WIDE RANGE OF OUTPUT FREQUENCIES," filed May 3, 2004, which applications are incorporated by reference herein.

BACKGROUND

1. Field of the Invention

This application relates to divider circuits and more particularly to programmable divider circuits useful for dividing high-speed signals.

2. Description of the Related Art

Many applications use divider circuits to divide high-speed clock signals. In order to provide flexibility, programmable divider circuits may be preferred in some applications. Several approaches for such programmable divider circuits are known in the art. For example, FIG. 1 illustrates a programmable divider based on a conventional dual modulus prescalar.

$$\text{The output frequency } f_{out} = \frac{f_{in}}{R(P+1)+(Q-R)P} = \frac{f_{in}}{QP+R}.$$

Several aspects of the divider circuit illustrated in FIG. 1 may make it undesirable for certain applications. For example, the feedback loop around P/(P+1) limits the maximum possible speed of the divider circuit and thus the speed of the signals that can be divided. Additionally, the clock input will be loaded by ($\log_2$ P+1) flip-flops. Also, synchronization circuitry is required to change the modulus and reset the counters correctly.

Another prior art approach is illustrated in FIG. 2, which shows a programmable divider based on a loadable backward counter. The circuit includes a loadable backward counter 201 with a zero detect circuit 203. The feedback loop formed by the first-stage SR counter, the zero detector, the load signal (with high fanout) may limit the maximum possible speed of the divider circuit in certain applications.

Accordingly, there is a need for an improved programmable divide circuit.

SUMMARY

In at least one embodiment of the invention, a method for dividing a first signal having a first frequency by a divide ratio to generate a lower frequency signal includes generating a first plurality of signals having a common frequency, a first pulse width, and different phases. The first plurality of signals is based, at least in part, on at least one signal having a second pulse width. The first pulse width is selected from a plurality of pulse widths based, at least in part, on the divide ratio. The method includes sequentially selecting individual pulses of the first plurality of signals as an output signal of a select circuit to generate an output signal having a frequency lower than the first frequency.

In at least one embodiment of the invention, an apparatus for dividing a first signal having a first frequency by a divide ratio to generate a lower frequency signal includes a pulse-width control circuit responsive to at least one signal having a first pulse width. The pulse-width control circuit is configured to generate a first plurality of signals having a common frequency, a second pulse width based, at least in part, on the divide ratio, and respective ones of different phases. The apparatus includes a select circuit configured to receive the first plurality of signals and to supply a first selected signal of the first plurality of signals as a select circuit output signal according to a select signal.

BRIEF DESCRIPTION OF THE DRAWINGS

The present invention may be better understood, and its numerous objects, features, and advantages made apparent to those skilled in the art by referencing the accompanying drawings.

FIG. 6 describes R values and divide-by values that may be associated with the phase selectable divider circuit of FIG. 4.

FIG. 12A illustrates count sequence generation logic used in a non-binary arithmetic circuit.

FIG. 12B illustrates the sequence of states sequenced through by the count sequence generation logic of FIG. 12A.

FIG. 12C illustrates operation of a non-binary arithmetic circuit.

FIG. 16 illustrates values of Q and R for various values of M and associated output frequencies according to an embodiment of the invention.

FIG. 17A illustrates a timing diagram associated with generation of signals having different phases.

FIG. 17B illustrates generation of signals having a particular pulse width being supplied to a phase switching multiplexer circuit according to an embodiment of the invention.

FIG. 17C illustrates a circuit useful to generate the signals in FIG. 17B from the signals in FIG. 17A.

FIG. 34 illustrates exemplary functionality of a pulse-width control circuit consistent with at least one embodiment of the invention.

FIG. 36 illustrates a block diagram of a finite state machine consistent with at least one embodiment of the invention.

FIG. 37 illustrates exemplary control signals used by the finite state machine of FIG. 36 consistent with at least one embodiment of the invention.

FIG. 38 illustrates an exemplary circuit for generation of control signals used by the finite state machine of FIG. 36 consistent with at least one embodiment of the invention.

The use of the same reference symbols in different drawings indicates similar or identical items.

DESCRIPTION OF THE PREFERRED EMBODIMENT(S)

Figure 1:
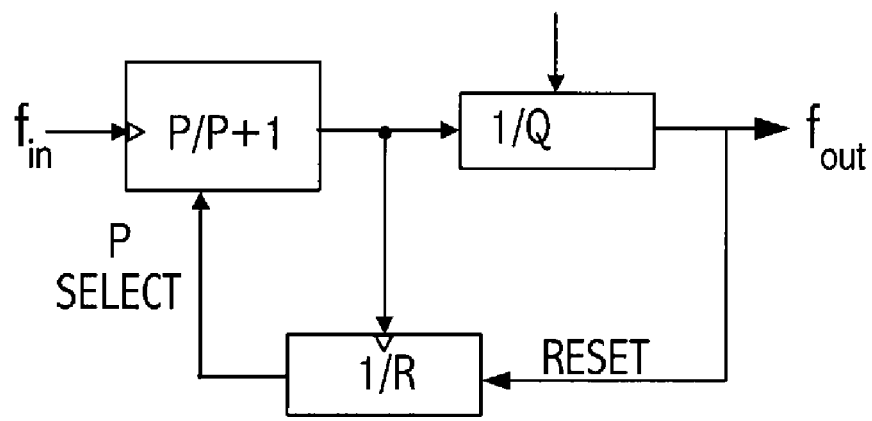
FIG. 1 illustrates a dual modulus prescalar divider circuit.
Figure 2:
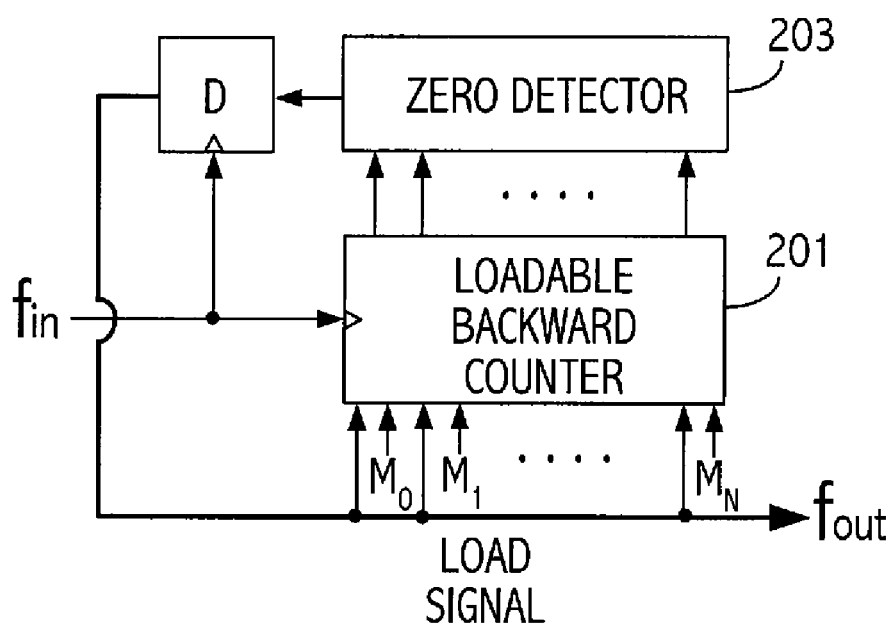
FIG. 2 illustrates a programmable divider using a loadable backward counter and a zero detect circuit.
Figure 3:
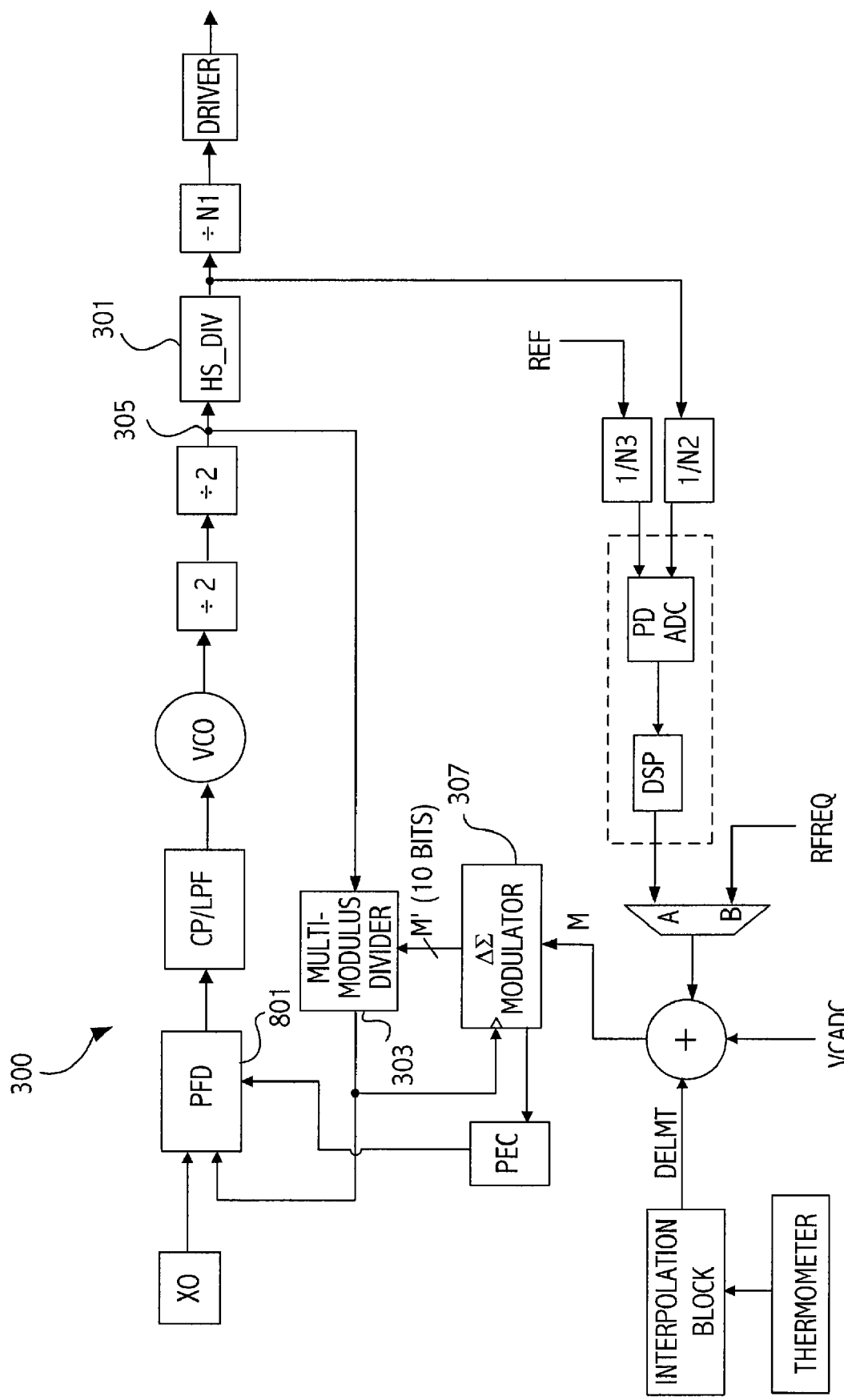
FIG. 3 illustrates a block diagram of an exemplary architecture that may utilize one or more embodiments of the divider circuit described herein.

Referring to FIG. 3, a block diagram illustrates an exemplary architecture 300 that may utilize divider circuits incorporating embodiments of the invention in, e.g., divider circuits 301 and 303. A divider circuit according to an embodiment of the invention is utilized to divide a clock signal supplied on node 305. In the exemplary embodiment illustrated in FIG. 3, the divider circuits 301 and 303 receive a clock signal supplied at node 305 that is approximately 2.5 GHz.

Figure 4:
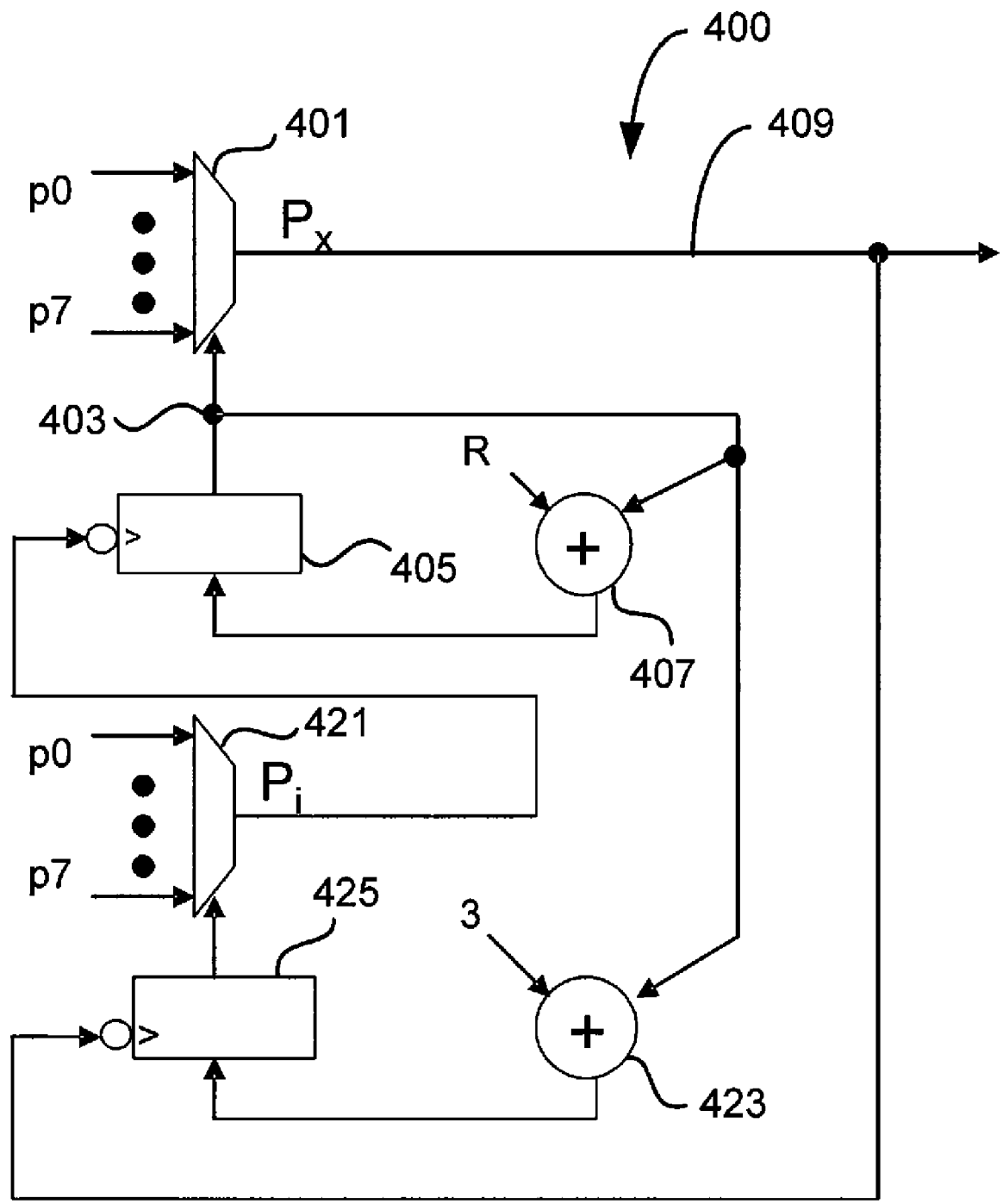
FIG. 4 illustrates a block diagram of a phase selectable divider circuit according to an embodiment of the invention.

Before describing divider circuit 303 in more detail in a specific implementation, a more general discussion of a phase selectable divider circuit will be provided. Referring now to FIG. 4, illustrated is a block diagram of a divider circuit 400 according to an embodiment of the invention. Eight clock signals P0-P7 are supplied to selector circuit 401. In the illustrated embodiment, selector circuit 401 is implemented as a multiplexer. A three-bit control signal 403 supplied from register 405 selects which of the clock signals P0 to P7 is output by the selector circuit.

Figure 5:
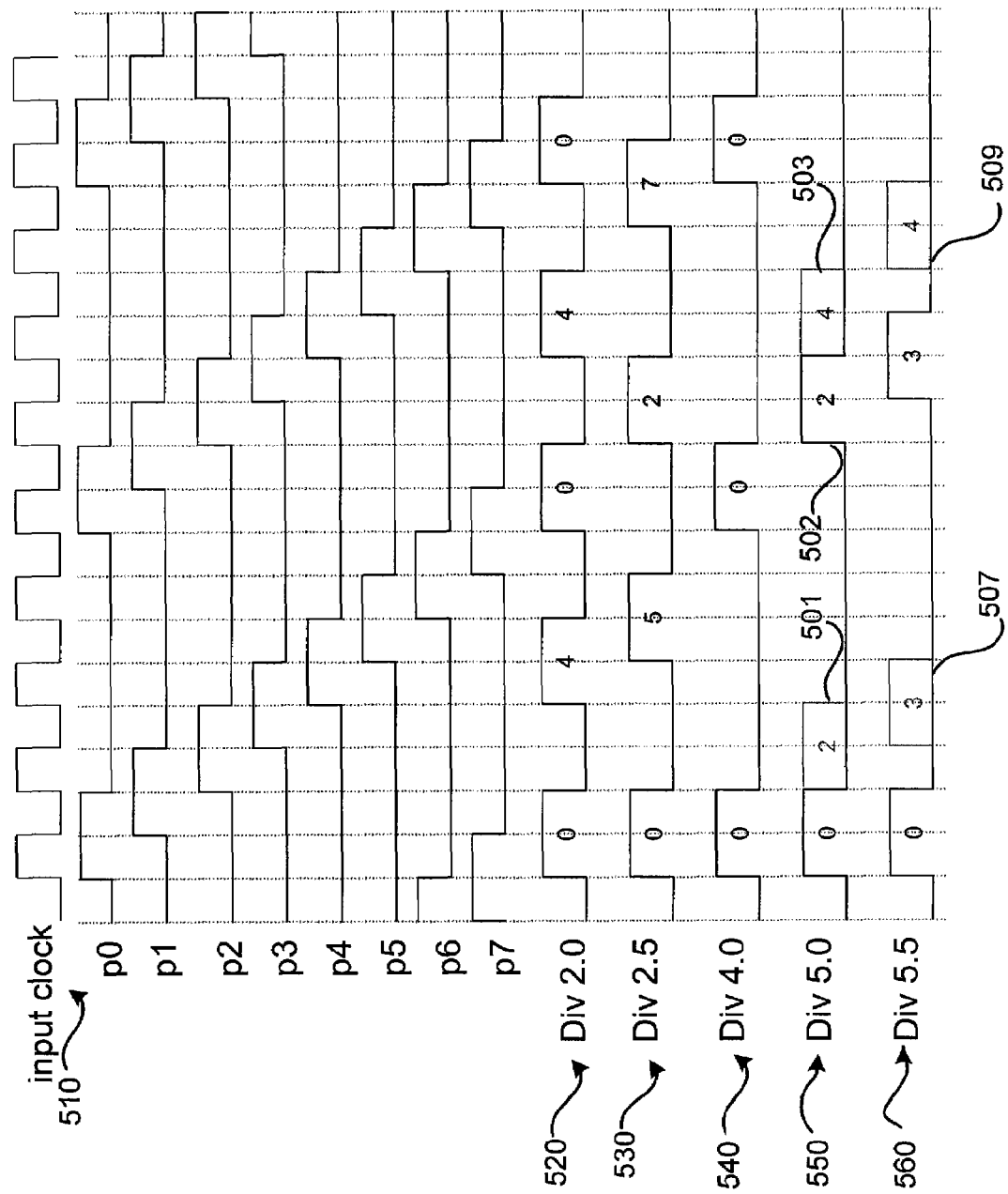
FIG. 5 illustrates a timing diagram associated with the phase selectable divider circuit of FIG. 4.

Referring to FIG. 5, a timing diagram illustrates the clock signals supplied to multiplexer 401 and waveforms supplied by the multiplexer 401. The clock signals P0-P7, having a different phase, are supplied to the multiplexer 401. Note that the pulse width of the clock signals P0-P7 may vary as described further herein. By selecting which clock signals are supplied by multiplexer 401, different frequency clock signals can be generated by the divider circuit. As shown in FIG. 5, the clock signals P0-P7 are derived from an input clock 510. In one embodiment, input clock 510 is approximately 2.5 GHz and the clock signals P0-P7 are one fourth of the input clock signal 510, or approximately 625 MHz. Referring again to FIG. 4, the divider circuit 400 selects the next pulse to be output by adding a value R to the current select signal 403 in summing circuit 407 to generate a sum that is supplied to register 405.

FIG. 6 illustrates values of R utilized in one embodiment of the invention. The use of the divider circuit 400 to generate a clock signal that is divided down from the input clock signal 510 will now be illustrated with reference to FIG. 5. Assume it is desired to divide the input clock signal by 2. Referring to FIG. 6, it can be seen that in order to divide-by-2 (the division factor), the appropriate value of R is 4. Assume that the currently selected clock is P0, so the select signal supplied from register 405 will be configured to select P0, e.g., using a value of 000. In order to select the next pulse output by the multiplexer, the summing circuit 407 adds the current value supplied from register 405 (which is 000) with the value of R (which is 4) and provides a sum of 4 to register 405 to select P4 as the next pulse output by multiplexer 401, as illustrated by the clock signal 520 (Div 2.0) shown in FIG. 5. The summing circuit 407 is implemented as a modulo N summing circuit where N equals the number of clock signals supplied to multiplexer 401, which is 8 in the illustrated embodiment. With 4 as the current value of the select signal supplied by register 405, the next value supplied as the select signal is 0, which selects P0 as the next pulse to be output by the select circuit 401. That is, 4 (the value of the select signal)+4 (the value of R)=0 in a modulo 8 summing circuit. R is continually added to the current select value to generate the next pulse, and a sequence of pulses selected from the phases P0 and P4 is output as shown in FIG. 5 to generate an output clock signal that equals the input clock/2.

A divide-by-2.5 will now be described. Assume that the currently selected clock is P0, so the select signal on control lines 403 will be configured to select P0, e.g., using a value of 000. Referring to FIG. 6, in order to divide-by-2.5 (the division factor), the value of R is 5. The summing circuit 407 provides a sum of 5 to register 405 to select P5 as the next pulse output by multiplexer 401, as illustrated by the clock signal 530 (Div 2.5) shown in FIG. 6. With 5 as the current value of the select signals, the next value supplied as the select signal is 2, which selects P2 as the next pulse to be output by the select circuit 401. That is, 5 (the value of the select signal)+5 (the value of R)=2 in a modulo 8 summing circuit. R is added to the current select value to generate the next select value, which is supplied to the select circuit. The next pulse selected is P7.

In the general case, for the circuit shown in FIG. 4, given 8 phases of a clock, with p(n) being the phase selected at a time "n," phase selection is accomplished by p(n+1)=(p(n)+R) mod 8. FIG. 5 also shows the pulses 540, 550, 560, selected respectively for divide-by-4, 5, and 5.5.

Referring to FIG. 6, note that for the embodiment illustrated in FIG. 4, the first three divide values (0.5, 1.0, 1.5) are not available. Also for longer divide operations, for example, divide-by-4.5, 5, or 5.5, where R=1, 2, or 3, the first pulses output in the longer divides need to be ignored. This is illustrated in FIG. 5. Thus, for example, for a divide-by-5, and assuming P0 is the initial pulse out, and R=2, the first P2 pulse 501 is ignored, but the second P2 pulse 502 is supplied by multiplexer 401. Similarly, after the second P2 pulse 502 is supplied, the first P4 pulse 503 is ignored. With the first pulse ignored each time, the effective value of M=9. The resultant waveform 550 supplied on node 409 is labeled Div 5.0 in FIG. 5. Similarly, the initial pulses 507 and 509 shown in FIG. 5 are ignored in a divide-by-5.5 as shown in waveform 560.

Referring again to FIG. 4, in order to achieve the necessary delay for the longer divides, e.g., the divide-by-5 and 5.5 shown in FIG. 5, in one embodiment a second selector circuit 421 is utilized with a second summer circuit 423 and a second register 425. A skip delay value of 3 is added to the current select value 403 in summing circuit 423. The skip delay indicates how many phase steps (each of clocks P0-P7 being a phase step) should be skipped before the select signal in register 405 is updated. As shown in FIG. 4, the output clock from multiplexer 401 on node 409 is used to update register 425 with the sum from summing circuit 423. The clock selected by multiplexer 421 is used to update the register 405. That ensures that the value of the select signals do not change until after the first pulses have been skipped for R equal to 1, 2, or 3. For example, if the currently selected clock is P0 and R=1, with a skip count of 3, register 405 is not updated until P3, thereby ensuring that the first P1 pulse is skipped. Referring to FIG. 5, a skip delay of three ensures that the undesirable pulses 501, 503, 507, and 509 are not output.

Note that in some embodiments, the multiplexer 401 may be coupled to receive an input signal that is a steady state input signal, e.g., ground, in addition to the various phase sets received. In that way, the multiplexer may be selected to output no signal by selecting the input coupled to ground.

Figure 7:
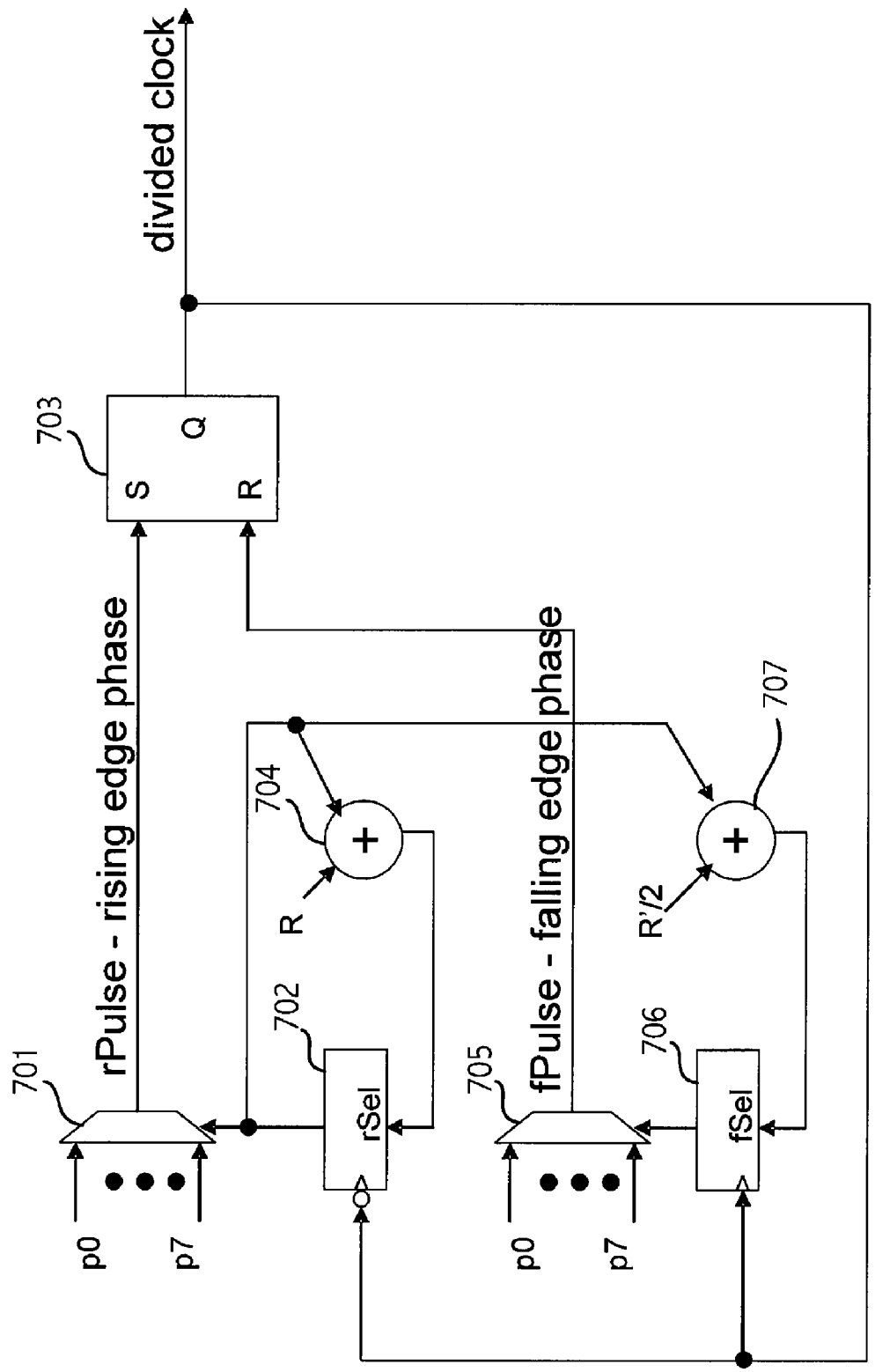
FIG. 7 illustrates another embodiment of a phase selectable divider circuit.

Referring to FIG. 7, in some embodiments, it may be desirable to make the output supplied have an approximately 50% duty cycle. That can be accomplished by using the pulse supplied by multiplexer 701 to set SR circuit 703 and using the multiplexer 705, register 706 and adder circuit 707, to create a falling edge by supplying the selected pulse supplied by multiplexer 705 to cause the SR circuit 703 to reset. In FIG. 7, summing circuit 707 is supplied with R'/2, where R' is the effective value of R, when the first pulse skip is taken into account, as shown in FIG. 6. The value of R' is shown in FIG. 6. Note that R'/2 is always greater than 3 for the divides than need to skip the first pulse. Note that in FIG. 7, the rising edge pulse (rPulse) and the falling edge pulse (fPulse) supplied by multiplexers 701 and 705, respectively, may be used as the feedback clock rather than the clock supplied by SR circuit 703. Note also that while a 50% duty cycle may be desirable in some embodiments, other duty cycles may be achieved by selecting a different phase from either or both multiplexers 701 and 705.

Figure 8:
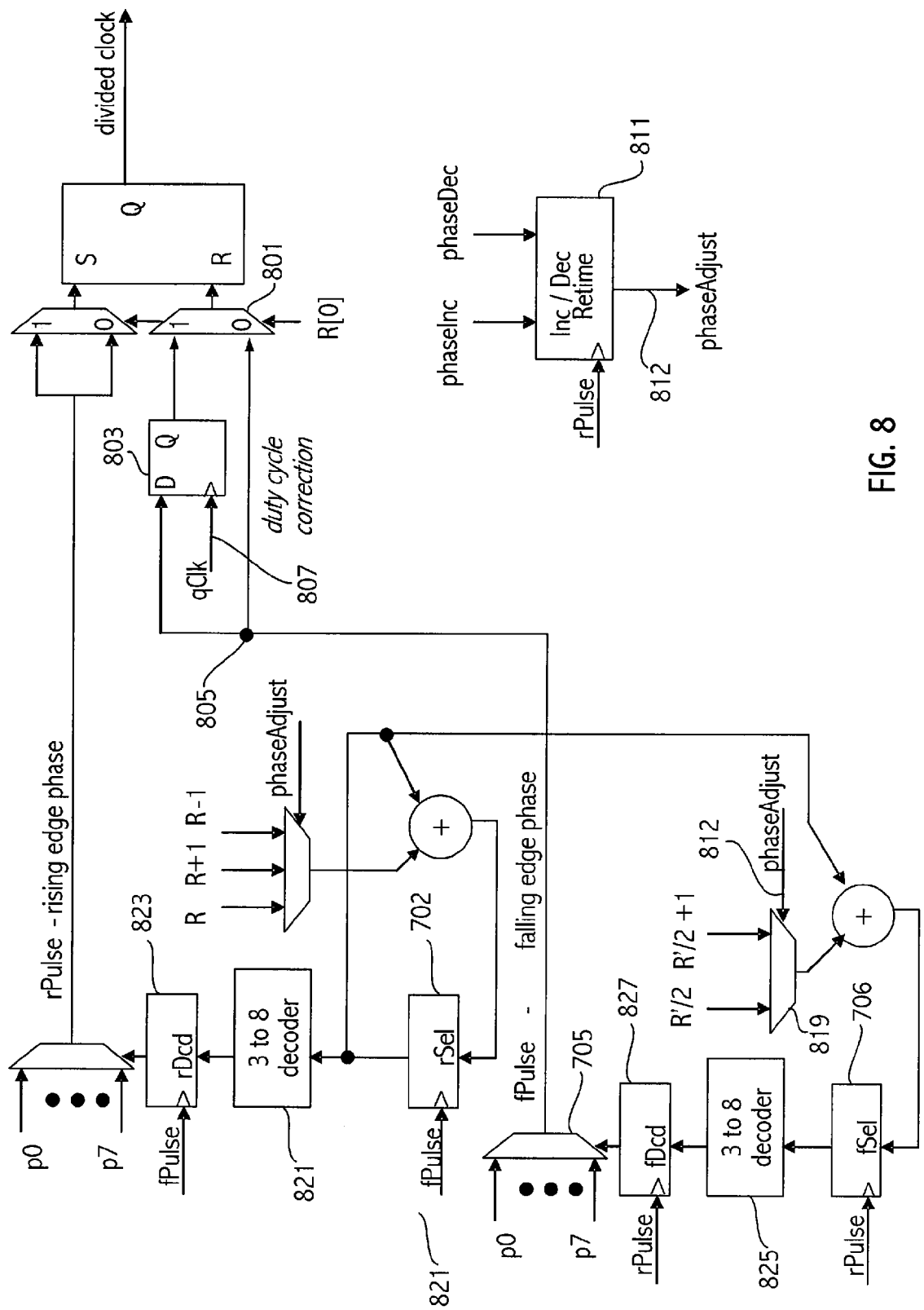
FIG. 8 illustrates another embodiment of a phase selectable divider circuit.

The signal supplied by SR circuit 703 is a signal having approximately a 50% duty cycle. However, for odd R' the duty cycle is not 50%. If a 50% duty cycle is required, duty cycle correction can be added to fPulse as shown in FIG. 8, for example, by multiplexing fPulse from multiplexer 705 with a quadrature clock delay in multiplexer 801. The delay is introduced in flip-flop 803, which receives fPulse from node 805 and is clocked by a quadrature clock 807. As shown in FIG. 8, the multiplexer 801 selects the delayed clock when the least significant bit of R is 1, indicating an odd value. In that way a 50% duty cycle clock is provided for all divide values.

FIG. 8 also illustrates additional details of the multiplexer decode, which includes a 3 to 8 decoder 821 and a decode register 823. The path to implement the falling edge also includes a 3 to 8 decoder 825 and a decode register 827.

FIG. 8 illustrates another option available, which is to introduce a phase adjust signal utilizing multiplexers 817 and 819. That allows the phase of the signal supplied by the divider circuit to be programmably adjusted. In the embodiment illustrated in FIG. 8, the phase adjust that can be introduced is one phase step (R+1 or R−1). In other embodiments, different phase adjust increments may be utilized. The multiplexer select signal phaseAdjust 812 supplied to multiplexers 807 and 809 is generated in circuit 811.

Figure 9:
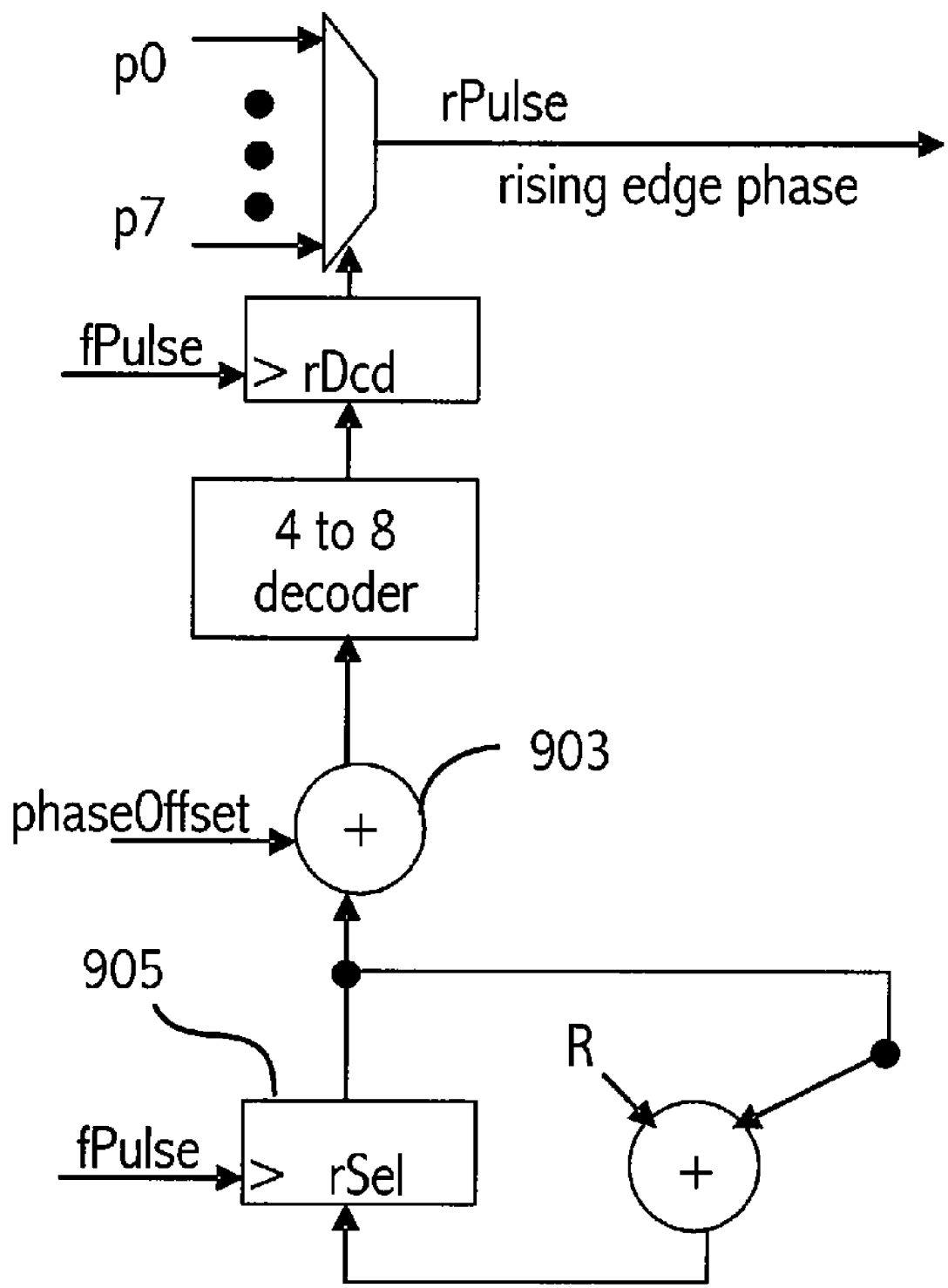
FIG. 9 illustrates another embodiment of a phase selectable divider circuit.

In some embodiments, as shown in FIG. 9, timing considerations may make it advantageous to separate the phase offset calculation into a separate summing circuit 903 and allow summing circuit 901 to just calculate the new select value provided to register 905.

Figure 10:
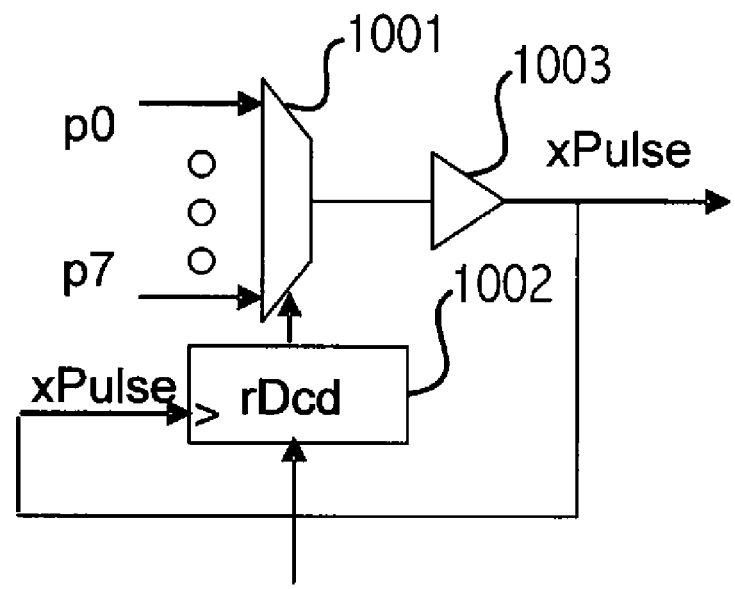
FIG. 10 illustrates timing aspects of an embodiment of a phase selectable divider circuit.
Figure 11:
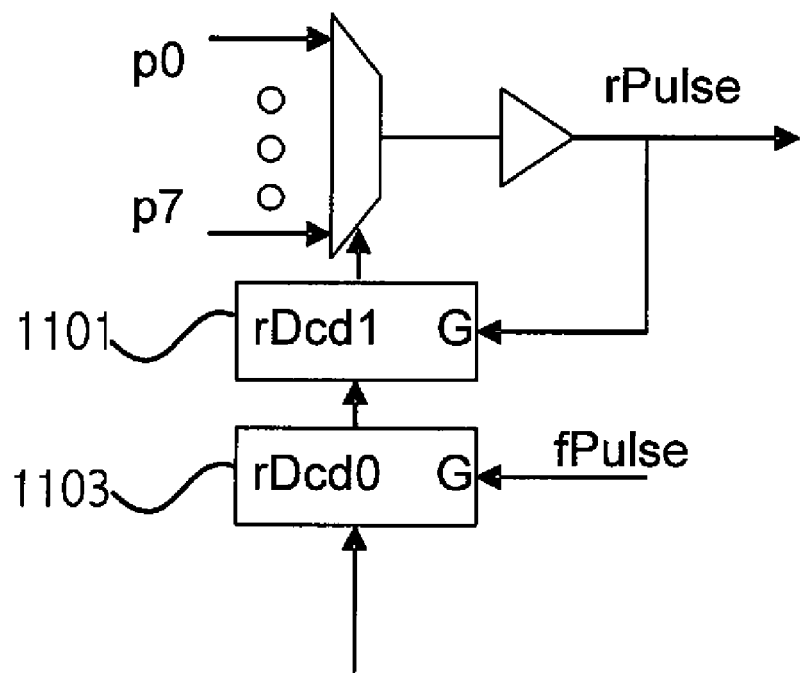
FIG. 11 illustrates an embodiment of a phase selectable divider circuit that addresses timing aspects.

In some implementations, the timing loop from multiplexer 701 to SR circuit 703, to the select register 702 back to multiplexer 701 may be too long in some process technologies. The same is true for the timing loop from multiplexer 705 to SR circuit 703, to select register 706 and back to multiplexer 705. Thus, for some embodiments, in order to achieve appropriate operational speed, the timing loops should be reduced. FIG. 10 illustrates one approach to a reduction in the timing loops. The delay from SR circuit 703 is removed and select register 1002 is clocked on the rising edge of the xPulse signal. That eliminates another one-half period of delay. However, xPulse is not "clean" any more. If the delay through 1001, 1002 and 1003 totals less than the pulse width of the clock signals P0-P7, the output rPulse of multiplexer 1001 will be cut short. In some embodiments a minimum pulse width of rPulse is required. Since the one-half period of delay is removed, extra pulses may be created when dividing by 4.5, 5.0, or 5.5. A two-phase latch based design using latches 1101 and 1103 as illustrated in FIG. 11 may be used so that the extra pulses do not cause a problem. Note that multiplex decoding, phase offset and pipeline can be added as long as the multiplex select output paths remained balanced.

Figure 13:
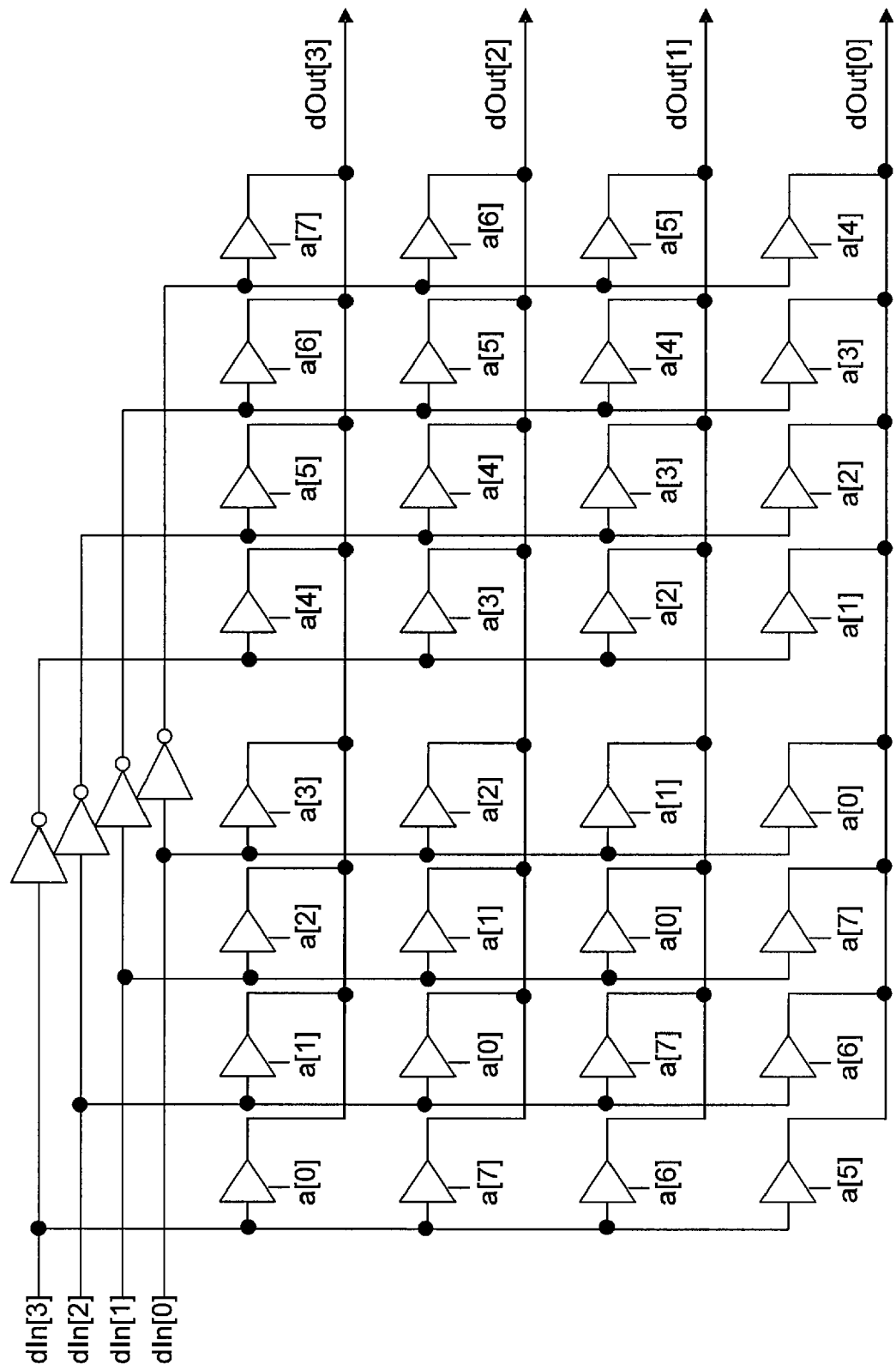
FIG. 13 illustrates an exemplary non-binary arithmetic circuit.

In another embodiment, in order to increase the speed of the adder circuits, e.g., 704 and 707, non-binary arithmetic may be used. Referring to FIGS. 12A-12C, operation of an exemplary non-binary arithmetic circuit is illustrated. The illustrated embodiment relies on count sequence generation logic 1200 that includes a shift register 1201 and inverter 1203 as illustrated in FIG. 12A. The count sequence generation logic 1200 sequences through eight states illustrated in FIG. 12B. FIG. 12C illustrates operation of the non-binary arithmetic. Assuming the current state is {d,c,b,a}. All next states are in this sequence: {d, c, b, a, ~d, ~c, ~b, ~a, d, c, b}, which are the eight possible states generated by the count sequence generation logic 1200. The subsequent state is based on the addend (+0 to +7) as shown in FIG. 12C. For example, assume the current state of the four-bit shift register is 3 (011X)={d, c, b, a}. Assuming two is added and the result is {b, a, ~d, ~c}=1X10, which from FIG. 12B equals 5. Thus, the addition operation includes shifting and inverting, but no carry. An exemplary adder circuit is illustrated in FIG. 13. Note that addend (a) is 1-hot encoded.

Figure 14:
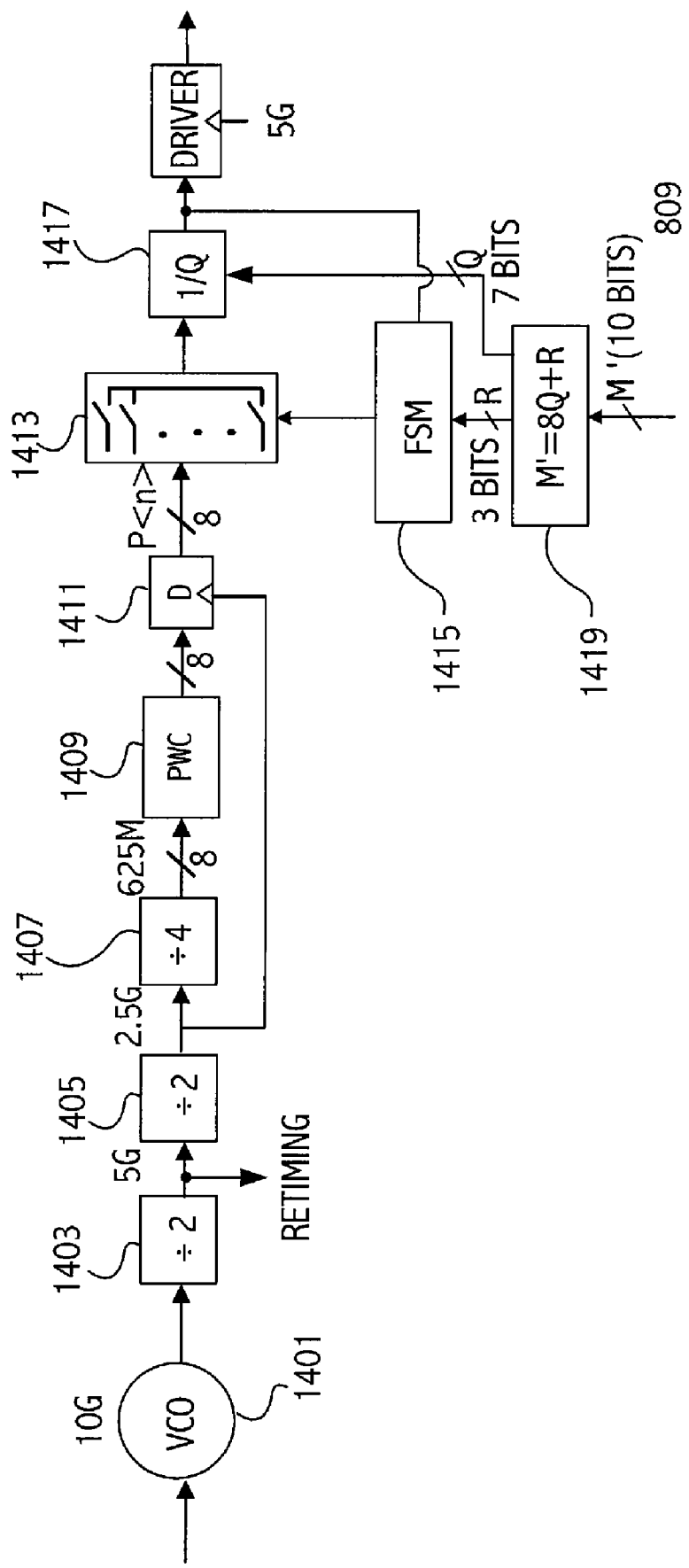
FIG. 14 illustrates a block diagram that includes a phase selectable divider circuit according to an embodiment of the invention.

Referring to FIG. 14, a block diagram illustrates a multi-modulus programmable divider circuit according to an embodiment of the invention. A voltage controlled oscillator 1401 provides an approximately 10 GHz clock signal, which is divided down in dividers 1403 and 1405 to an approximately 2.5 GHz clock signal. In order to operate the divider at a high frequency with low power consumption, some embodiments avoid feeding control signals to the high-speed circuitry. Instead, one embodiment utilizes a minimum number of transistors in the high-speed portion to save power and take advantage of the multiphase output of a divider described herein to achieve equivalent speed. The programmability is pushed into the lower frequency circuitry. The 5 GHz signal from node 1403 is fed to a cascade of two dividers, divider 1405, which is a divide-by-two (/2) and divider 1407, which is a divide-by-four phase generator that generates eight different phases. Divider 1407 supplies pulse-width controller (PWC) 1409, which in turns supplies an 8-to-1 phase selecting multiplexer 1413 through flip-flops 1411. The phase selecting multiplexer 1413 directs one of the eight (8) phases from the PWC 1409 to its output. The output of the multiplexer 1413 is used to clock a divide-by-Q counter (/Q) 1417, which generates the divider output. The divider circuit 1417 may be implemented as a variable divider circuit as described further herein. The output is also used to trigger a finite state machine (FSM) 1415, which implements the multiplexer control (phase selection) algorithm.

Figure 15:
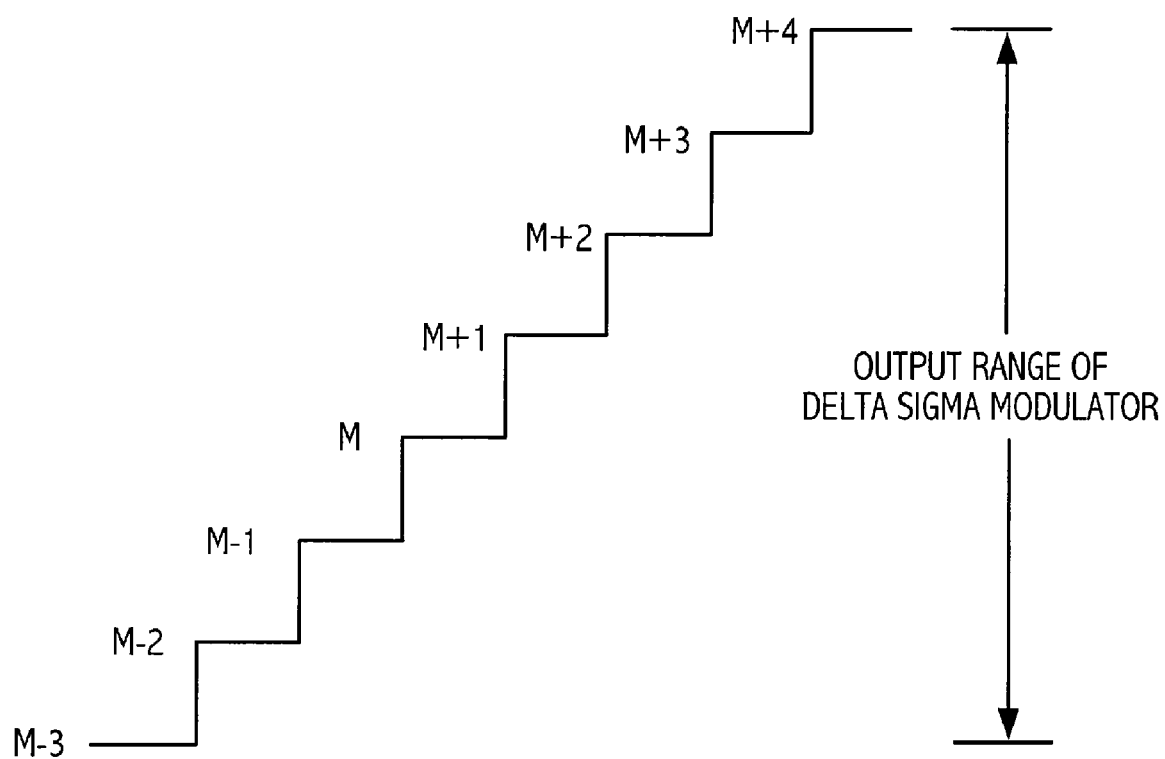
FIG. 15 illustrates an exemplary output range of the delta sigma modulator supplying a divide ratio.

In one embodiment, as illustrated in FIG. 14, block 1419 is supplied a stream of integers M' by a delta sigma modulator (see delta sigma modulator 307 in FIG. 3) to provide fractional n divide capability. M' is a sequence of integers that approximates the rational number M. Note that in some embodiments, block 1419 may be incorporated into the finite state machine 1415. Assuming the input frequency is $f_{in}$ and the output frequency is $f_{out}$, the divide ratio M=$f_{in}/f_{out}$. In one embodiment M=((9.7 GHz~11.32 GHz)/2)/(10 MHz (Xoxc) ~320 MHz (SAW)). Thus, M=15.15625~566. In one embodiment, the delta sigma modulator is an eight level quantizer that expands the fractional range to M−3 to M+4 as illustrated in FIG. 15. The delta sigma modulator may be implemented, e.g., as a third order delta sigma modulator. Given that expansion of the fractional range of M, M ranges from approximately 12 to approximately 570. The divider circuit illustrated in FIG. 14 operates fundamentally as an integer divider with the M' value updated at a frequency varying from approximately 416 MHz for an M value of 12, to an update frequency of approximately 9 MHz for an M value of 570.

The operation of the divider described in FIG. 14 can be understood from the following arithmetic expression:

$$\begin{array}{r} 8\dfrac{Q}{M'} \\ \underline{-8Q} \\ R \end{array}$$

where Q is the quotient and R is the remainder, and M' is the divider ratio. From that arithmetic expression, the divide ratio M'=8Q+R. The divide ratio is thus split into a constant coefficient (here 8, although other numbers are of course possible) multiplied by a quotient Q, which is >=1 and a remainder (R). The R portion is implemented through the phase-selecting multiplexer 1413 being controlled by the finite state machine (FSM) 1415. Control logic 1419 receives the divide ratio M', splits it into two portions, a Q number and an R number. The Q number is sent to Q divider input bits, while the R number is used by the finite state machine 1415, which is described further herein. The 8Q value can be understood as a coarse tuning capability, while the R value provides a finer tune capability. Note that FIG. 4 may be thought of as a special case of FIG. 14 where Q=1, thus providing a narrower divider range than embodiments where a Q divider is utilized.

The divide-by-8, the constant coefficient, can be accomplished in the higher speed divide circuits 1405 and 1407. The divide-by-Q and the divide-by-R can be performed in lower speed circuitry. The divide-by-Q can be performed in variable divider circuit 1417, which has a much lower input frequency, thus can be implemented with low speed circuitry. The divide-by-R can be achieved in the phase selecting multiplexer 1413. The multiplexer 1413 chooses the phase that is R steps offset (R can be positive or negative) from the last phase in each cycle of the output, thus achieving the division factor 8Q+R. By varying both Q and R, flexible programmability is achieved. Various values of R may be utilized, examples of which are shown below:

R=(−4, −3, −2, −1, 0, 1, 2, 3)
R=(−3, −2, −1, 0, 1, 2, 3, 4),
R=(−2, −1, 0, 1, 2, 3, 4, 5),
R=(−1, 0, 1, 2, 3, 4, 5, 6),
R=(0, 1, 2, 3, 4, 5, 6, 7)

In each R scheme shown above, there are eight values corresponding to each phase step. The R scheme chosen determines the minimum available division ratio and the maximum input frequency at the input of Q counter. For example, comparing scheme R=(−4, −3, −2, −1, 0, 1, 2, 3) to R=(0, 1, 2, 3, 4, 5, 6, 7), the first scheme can achieve the minimum divide ratio of /4, while the second one can only achieve the minimum divide ratio of /8. However, the first scheme requires the Q counter to be able to operate at a much higher frequency. The first scheme also imposes tighter timing requirement on multiplexer control signal generation compared to the other R scheme. It also consumes more power and may require custom design of the digital circuitry.

FIG. 16 shows an example of M'/Q/R values and output frequency for input frequency of 2.5 GHz and R=(−3, −2, −1, 0, 1, 2, 3, 4). In the absence of phase switching (R=0), the divider chain in FIG. 14 has a division factor of 8Q.

Referring to FIGS. 14 and 17A, the divide-by-four phase generator 1407 produces four pair of differential waveforms (8 phases) p<0> to p<7>, each having a phase shift of π/4 with respect to the period of waveforms p<0> to p<7>. Assuming the input clock in FIG. 17A is 5 GHz, the divide-by-eight clocks produced are 625 MHz. In the illustrated embodiment, the pulse width is half of the period of the divide-by-eight clocks produced. In some embodiments, in order to make phase switching backward possible (R<0) and prevent pulse overlap and glitching generation while switching from one phase to the other, the pulse-width control (PWC) block 1409 is utilized.

Figure 18A:
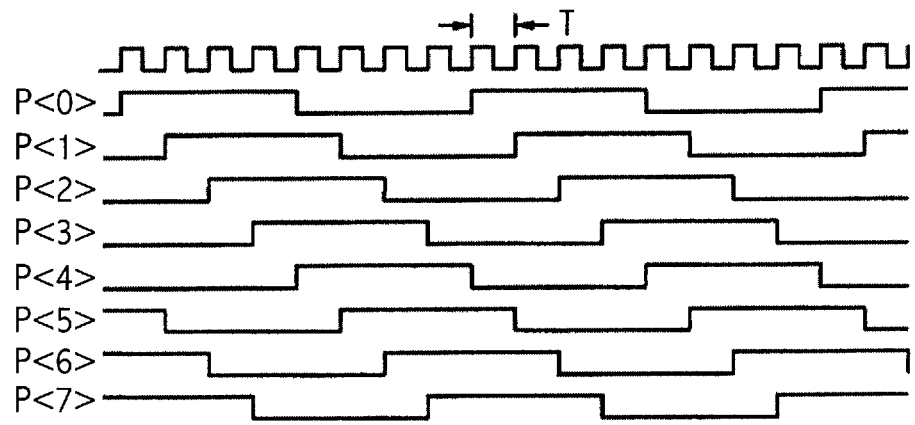
FIG. 18A illustrates a timing diagram associated with generation of signals having different phases.
Figure 18B:
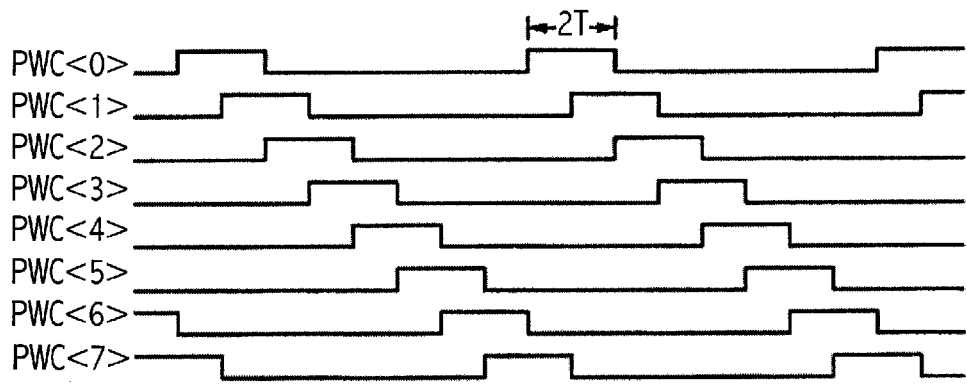
FIG. 18B illustrates generation of signals having a particular pulse width being supplied to a phase switching multiplexer circuit according to an embodiment of the invention.
Figure 18C:
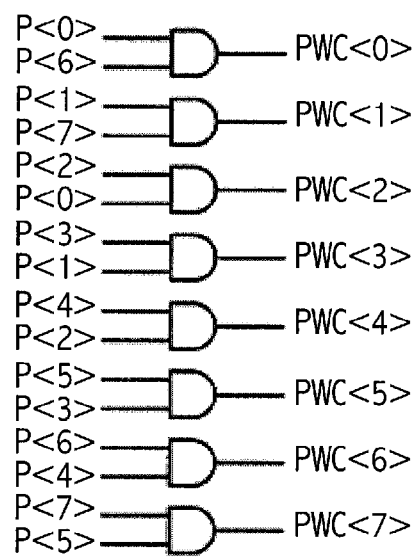
FIG. 18C illustrates a circuit useful to generate the signals in FIG. 18B from the signals in FIG. 18A.

The PWC block 1409 regenerates these multiphase outputs from the four phase generator 1407 into clocks pwc<0> to pwc<7> as shown in FIG. 17B by shrinking the pulse width from 4T to T or 2T (where 1/T is the input frequency). Choosing either a T or 2T pulse-width scheme is a trade-off between circuit power consumption and the minimum R desired. If it is desirable to achieve R=−4, a pulse width equal to T would be preferred in certain embodiments, since the space between the falling edge of the first pulse and the rising edge of the second pulse would be larger. However, generating a pulse width equal to T requires greater power consumption compared to a 2T pulse-width generation for the same rising/falling time to pulse-width ratio. One embodiment of pulse-width block 1409 is shown in FIG. 17C which utilizes AND gates. For example, AND gate 1701 logically combines p<0> and p<5> to generate the clock signal pwc<0> having a pulse width T. A similar approach can be used to generate pulse width of 2T as illustrated in FIGS. 18A-18C.

Figure 19:
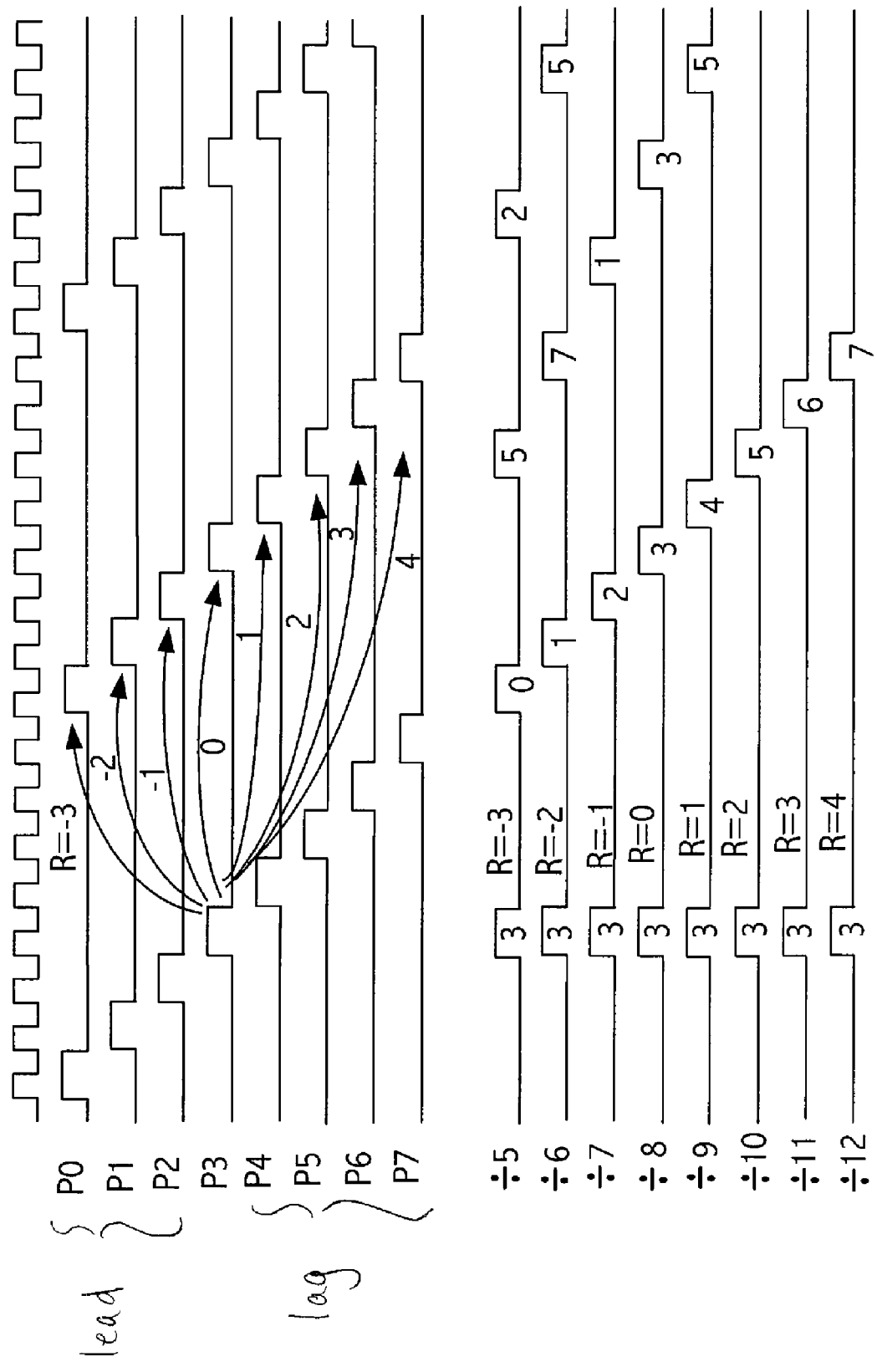
FIG. 19 illustrates operation of the divider circuit in FIG. 14 according to an embodiment of the invention.

FIG. 19 shows how the phase switching multiplexer 1413 functions to generate divided clocks in one embodiment. The divide values illustrated in FIG. 19 are divide-by-5, 6, 7, 8, 9, 10, 11, 12. Other divide values are of course possible. Note that in the illustrated embodiment, R is a value that indicates by how much the next pulse lags or leads the phase of the currently selected clock. Negative R represents the phase switching to an earlier phase (leads current phase), while positive R indicates that the phase of the next pulse lags the current pulse. To have a divide ratio less than 8 (e.g., /5, /6, /7) the phase is switched periodically to a waveform that is leading the current waveform by |R|*π/4, where R=−1 for /7; R=−2 for /6; R=−3 for /5. To have a divide ratio >8, the phase is switched periodically to a waveform that is leading the current waveform by |R|π/4, where R=1 for /9; R=2 for /10, R=3 for /11 and R=4 for /12.

Assume the pulse currently selected by multiplexer 1413 selected pulse is P3. The next pulse to be selected based on an R value from −3 to 4 is illustrated. Thus, for R=−3, the next pulse is P0 which lags the next P3 pulse that would otherwise be output if the multiplexer continued to output the currently selected clock. Similarly, for R=4, the next pulse selected is P7, which leads the next P3 pulse that would otherwise be output (if R=0) by 4 pulse steps. FIG. 19 also illustrates the divided clocks generated by the phase selecting multiplexer for divide-by-5, 6, 7, 8, 9, 10, 11, and 12.

Figure 20:
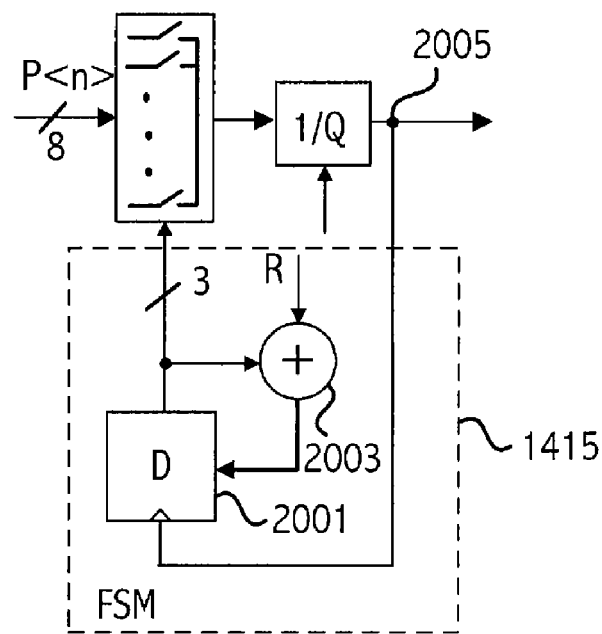
FIG. 20 illustrates an exemplary finite state machine that may be used in the divider circuit of FIG. 14.

FIG. 20 illustrates a block diagram of one embodiment of finite state machine 1415. Other embodiments may utilize the control structures described herein and illustrated, e.g., in FIGS. 4, 7, or 8. In FIG. 20, the FSM includes modulo summing circuit 2003 that supplies storage location 2001 the new select value. The storage location 2001 is updated by the divider clock supplied on node 2005. For each output cycle, the FSM updates to the new phase by adding R phase steps (R value can be negative) to the currently selected value. Note that in some embodiments, both the Q counter and FSM can be implemented with standard cells synthesis since they both operate at relative lower frequency.

Figure 21:
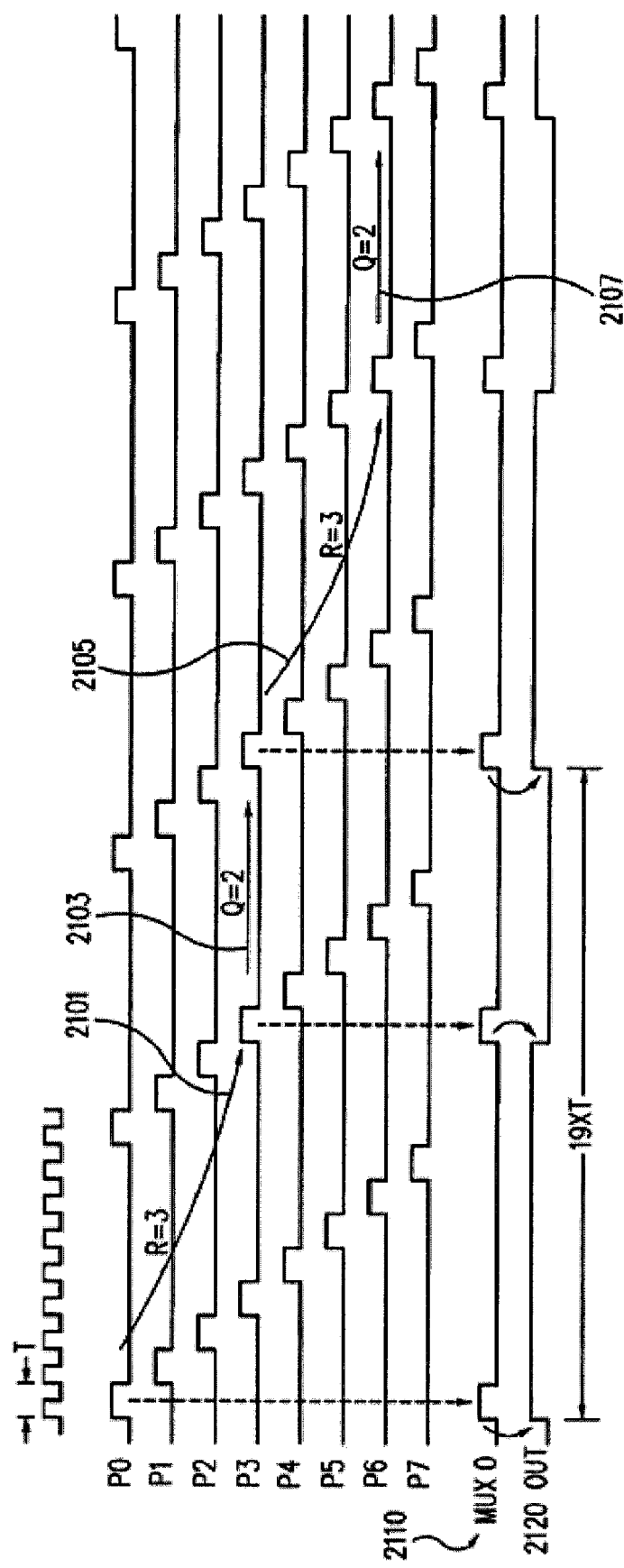
FIG. 21 illustrates an example of a divide-by-19 according to an embodiment of the invention.

Referring to FIG. 21, a timing diagram illustrates an example of building an output clock for a divide ratio of M'=19 utilizing the divider illustrated in FIG. 14. As shown in FIG. 14, a 10 bit M' value is supplied to block 1419 from the delta sigma modulator (not shown in FIG. 14). The finite state machine 1415 receives three bits specifying the value of R and the variable divider circuit 1417 receives a 7 bit Q value specifying the Q divider value.

For the divide-by-19 example shown in FIG. 21, M'=8*2+3, where Q=2 and R=3. Assuming the current phase selected by multiplexer 1413 is P0, which is the first pulse of the output from the multiplexer shown in waveform 2110 (mux0) in the timing diagram of FIG. 21. With R=3, and Q=2, the next pulse out is P3 as indicated by arrow 2101. With Q=2, two pulses pass through phase select multiplexer 1413 (FIG. 14) at this phase before the sum generated by sum circuit 2103 is updated in select register 2101. The arrows 1902, 1905, and 1907, show the pulses output by phase selector multiplexer 1413 under control of FSM 1415. The resultant waveform 2110 is shown in FIG. 21. The signal supplied on Qout is also shown. With R=2, the output from the multiplexer is divided by two. For the illustrated embodiment, the period of the waveform from the divider circuit 1417 is 3800 picoseconds, which is 19 times longer than the 200 picosecond period of the 5 GHz clock signal.

Figure 22:
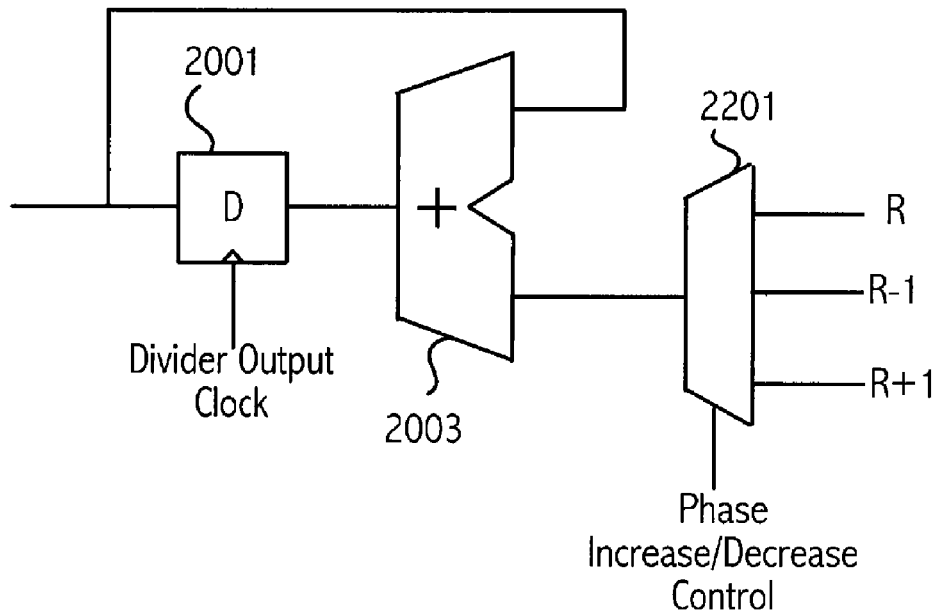
FIG. 22 illustrates a circuit for dynamically adjusting the output phase.

Certain applications require that the frequency synthesizer provide digitally controlled output phase adjustment (e.g., for system clock skew compensation). Such capability was described with relation to FIG. 8. FIG. 22 illustrates how the FSM of FIG. 20 can be modified to achieve this capability. Multiplexer 2201 selects which value of R is supplied to the summing circuit 2003. To have an output clock phase increment (or decrement) by 400 ps (assuming, for example, a 2.5 GHz input frequency), the multiplexer selects the next (or previous) phase (waveform). For example, when phase increase control=1, multiplexer 2201 selects R+1. When it is desired to decrease phase, the phase decrease control is set to one and multiplexer 2201 selects R−1. If no phase adjustment is required, multiplexer 2201 continues to select input R.

Figure 23:
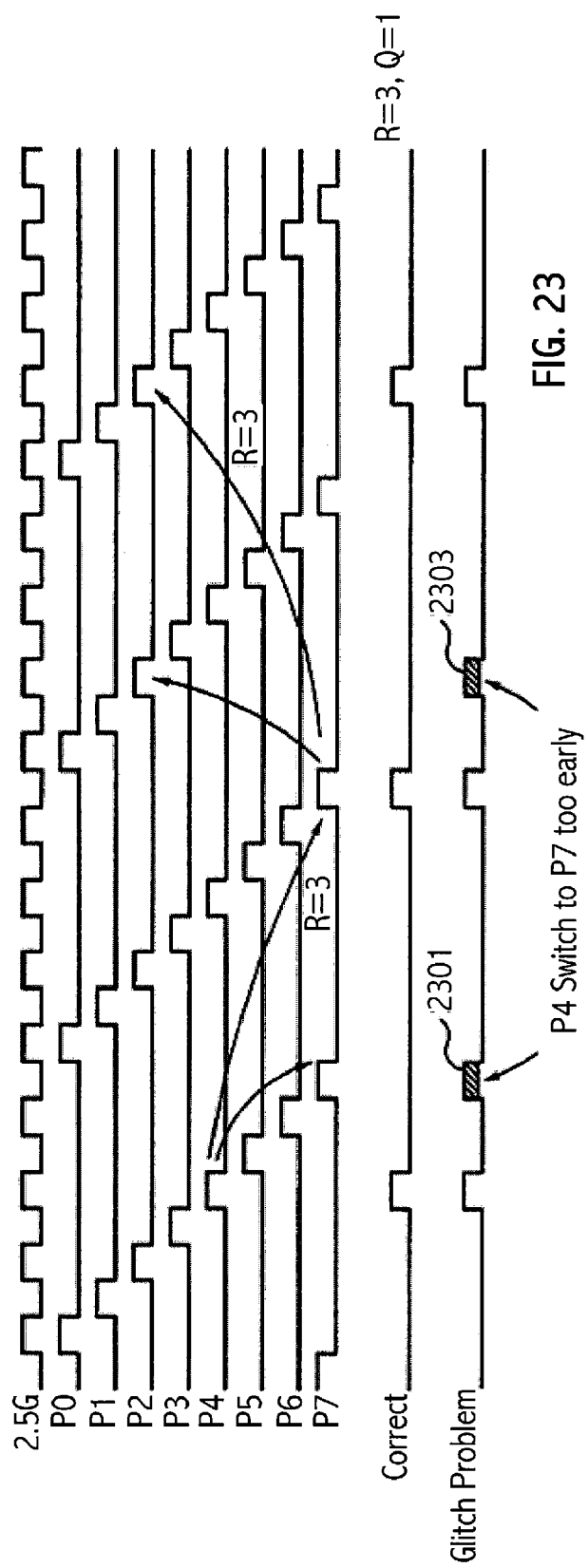
FIG. 23 is a timing diagram illustrating how glitches may occur.

Undesired glitches can occur when switching from one phase to the other if appropriate precautions are not taken. FIG. 23 shows an example of divide-by-11 (Q=1, R=3) illustrating the potential problem. Assuming P4 is the initial pulse and R=3, there is potential for P4 to switch to P7 too early as illustrated by pulses at 2301 and 2303, which would result in an undesired divide ratio. To prevent that, it is necessary to appropriately control the order and timing of the phase transition. That is similar to the potential problems with long divides described in relation to FIGS. 4 and 5.

Figure 24:
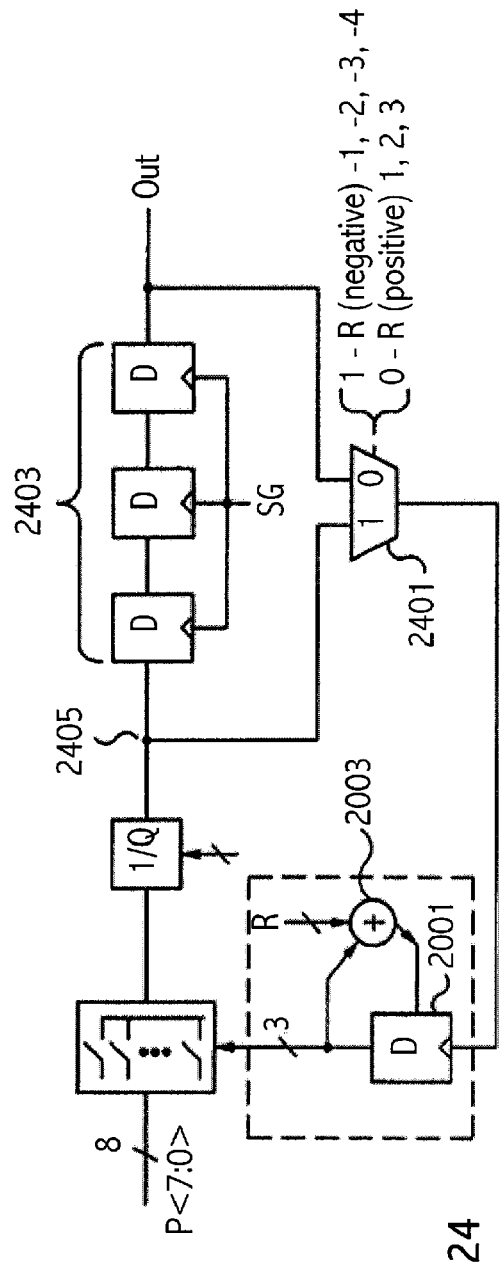
FIG. 24 illustrates an embodiment of a phase selectable divider circuit that address the problem of glitches.

Referring to FIG. 24, an embodiment is illustrated in which a delay is selectively used to clock the select register 2001 to block the unwanted pulses. When R is greater than or equal to 0, multiplexer 2401 selects a delayed clock value provided by delay circuit 2403 as the clock to update the select register 2403. When R is less than 0, multiplexer 2401 selects the Q divider output on node 2405 as the clock to update the select register 2001. In that way, the unwanted pulses shown in FIG. 23 are avoided.

Figure 25:
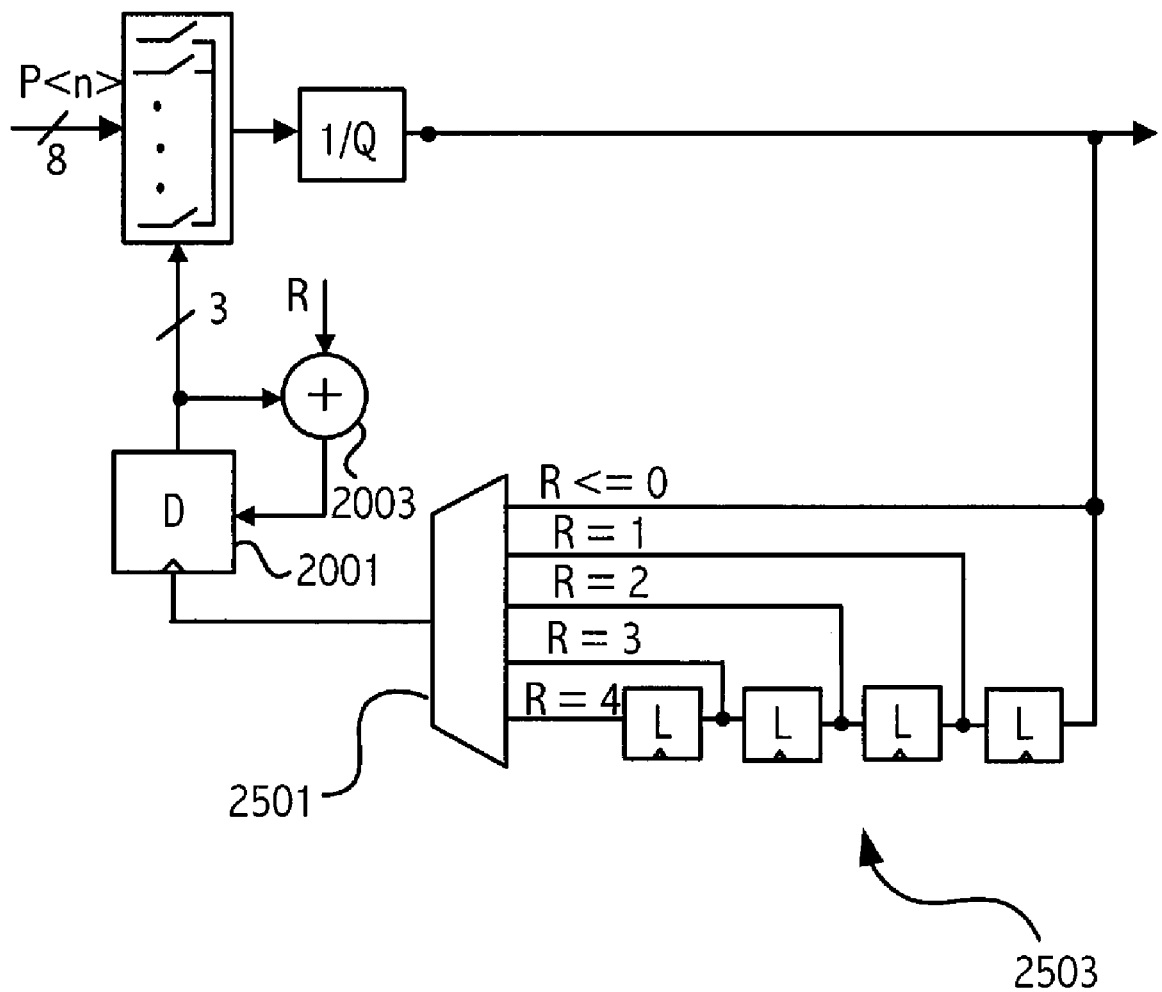
FIG. 25 illustrates an embodiment of a phase selectable divider circuit that addresses the problem of glitches.

FIG. 25 illustrates another embodiment to block unwanted glitches that utilizes a selectable feedback clock delay chain through a multiplexer 2501. For R<=0, no delay is needed. For R>=0, the delay flip-flop chain 2503 is utilized. The delay chain is tapped at each latch output and supplied to the multiplexer. The multiplexer selects the appropriate clock delay based on the R value. If a half rate of the input clock to the divider is used for the trigger, only 2 D flip flips (4 latches) is needed. An alternative is to use a full rate input clock to trigger the delay chain. However, compared to a full rate of input clock trigger, the half-rate scheme consumes less power and uses fewer numbers of D flip-flops. Using an even lower rate of clock (e.g., from /4) to trigger is also possible. Glitch-free phase switching can also be implemented by using an additional (supplementary) phase selecting multiplexer to generate the appropriate timing delay (or phase offset), which is then used to trigger the phase switching of the main phase selecting multiplexer as illustrated in FIGS. 4, 7, and 8.

Figure 26:
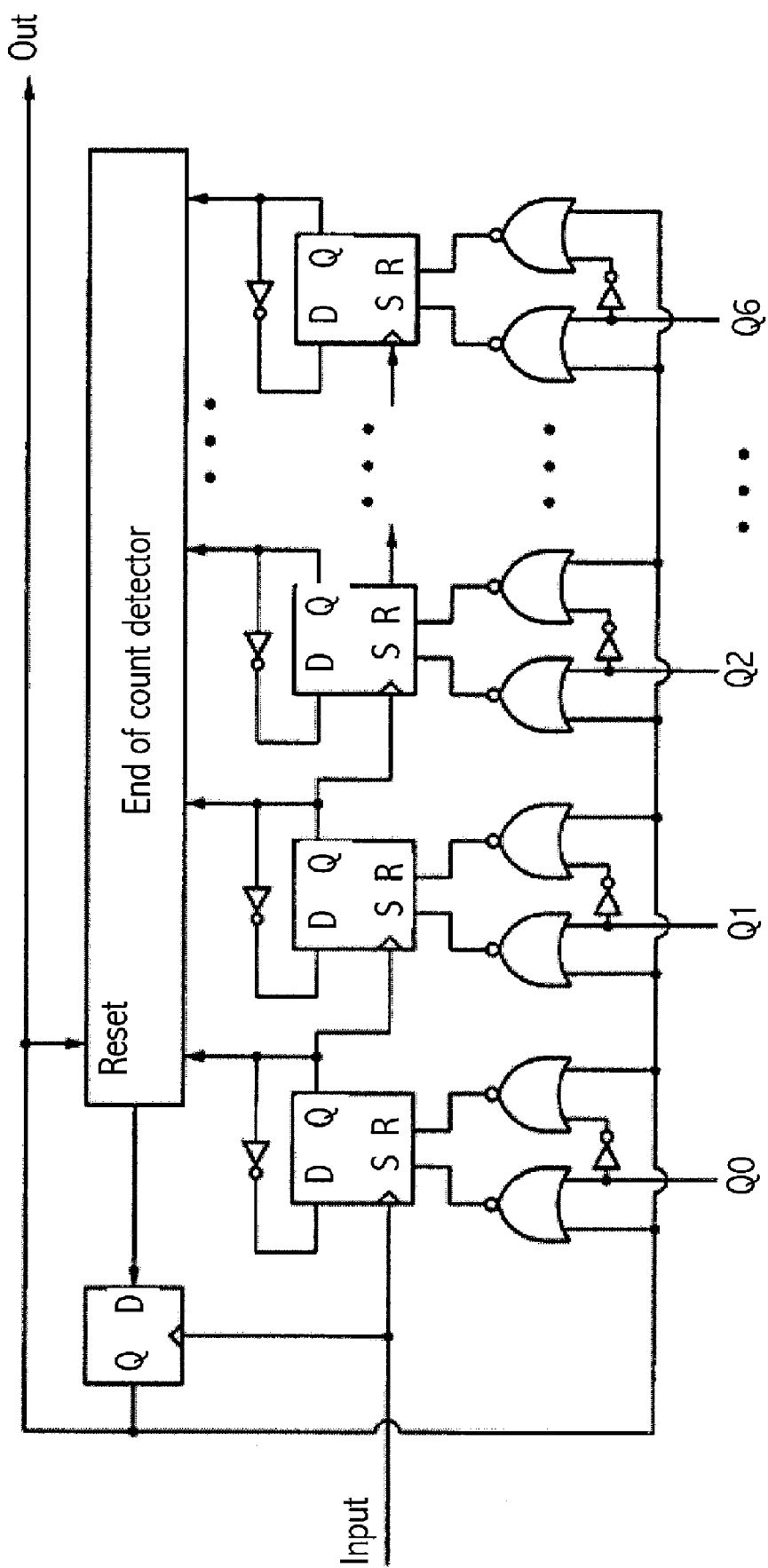
FIG. 26 illustrates an exemplary embodiment of a variable divider circuit that may be utilized in the divider circuit shown in FIG. 12.

The variable divide counter 1417 may be implemented in a variety of ways well known to those of skill in the art. One such implementation is illustrated in FIG. 26, which provides a 7 bit variable divide value supplied on node Q0 to Q6.

Figure 27:
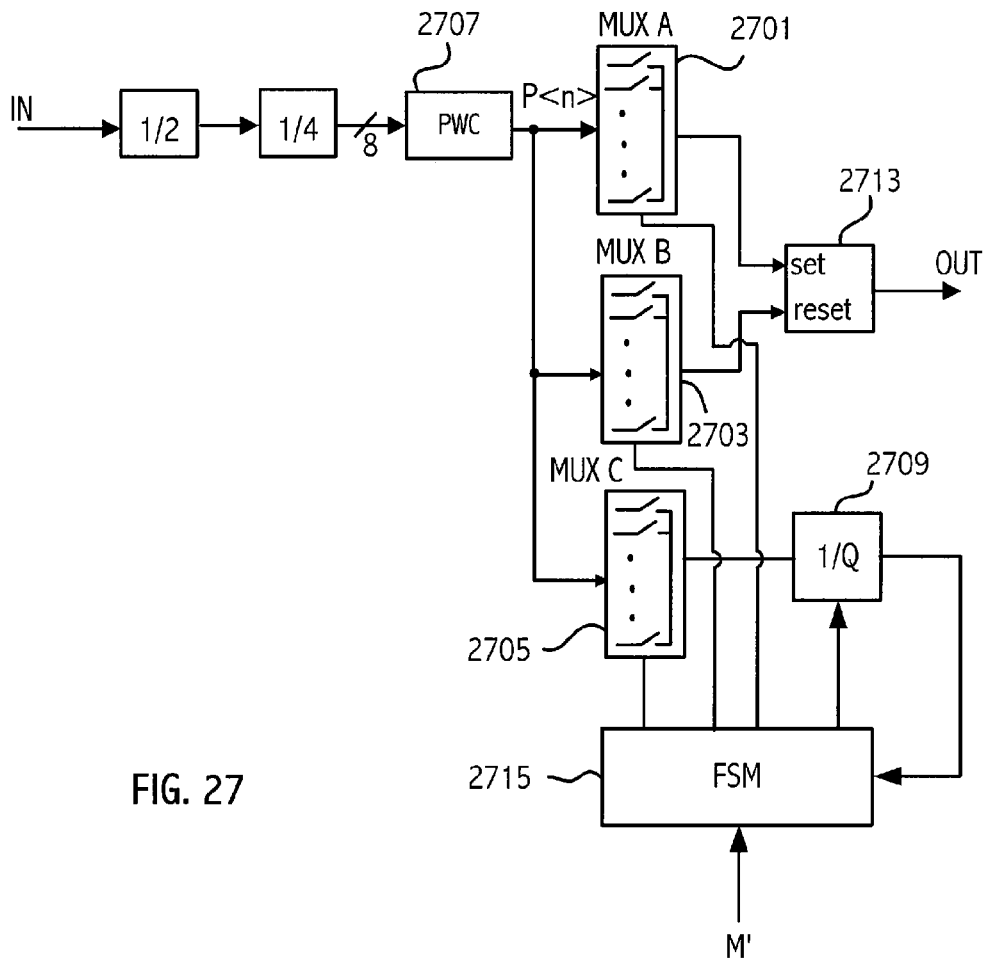
FIG. 27 illustrates an embodiment for achieving duty cycle correction.
Figure 28:
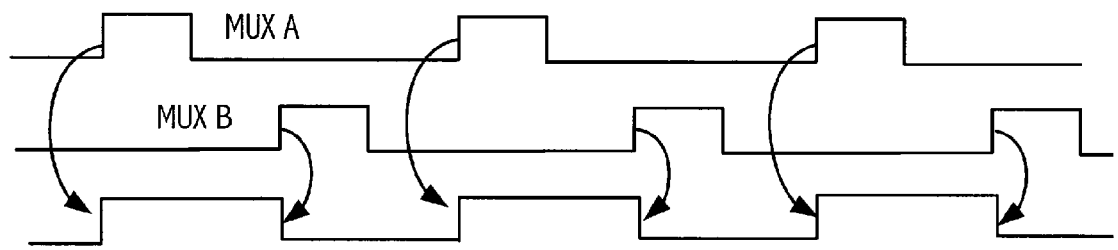
FIG. 28 illustrates operation of duty cycle correction.

Many applications require that the divider output waveform have a particular duty cycle, e.g., 50%. One approach to achieving duty cycle correction is illustrated in FIGS. 7 and 8. Another embodiment implementing duty cycle correction with two additional phase switching multiplexers and a set/reset latch is shown in FIG. 27. There are three phase switching multiplexers 2701 (mux A), 2703 (mux B), and 2705 (mux C) connected to PWC output 2707. The output of multiplexer 2705 is connected to the Q divider 2709, which generates the expected output frequency and is used for clocking the finite state machine (FSM) 2715. Multiplexer 2701 and multiplexer 2703 are used to generate the two waveforms that have a relative phase offset of a half period (for 50% duty cycle) of the output waveform. The two waveforms are generated and combined through a set/reset latch 2713. The waveform from multiplexer 2701 is used to set the rising edge of the output waveform, while the multiplexer 2703 waveform resets the falling edge. In order to generate waveforms having a duty cycle other than 50%, the relative phase offset of the two waveforms used to set and reset the SR latch may be varied. The three sets of phase switching control signals are generated from the finite state machine (FSM) 2715. FIG. 28, illustrates operation of the embodiment illustrated in FIG. 27.

Figure 29:
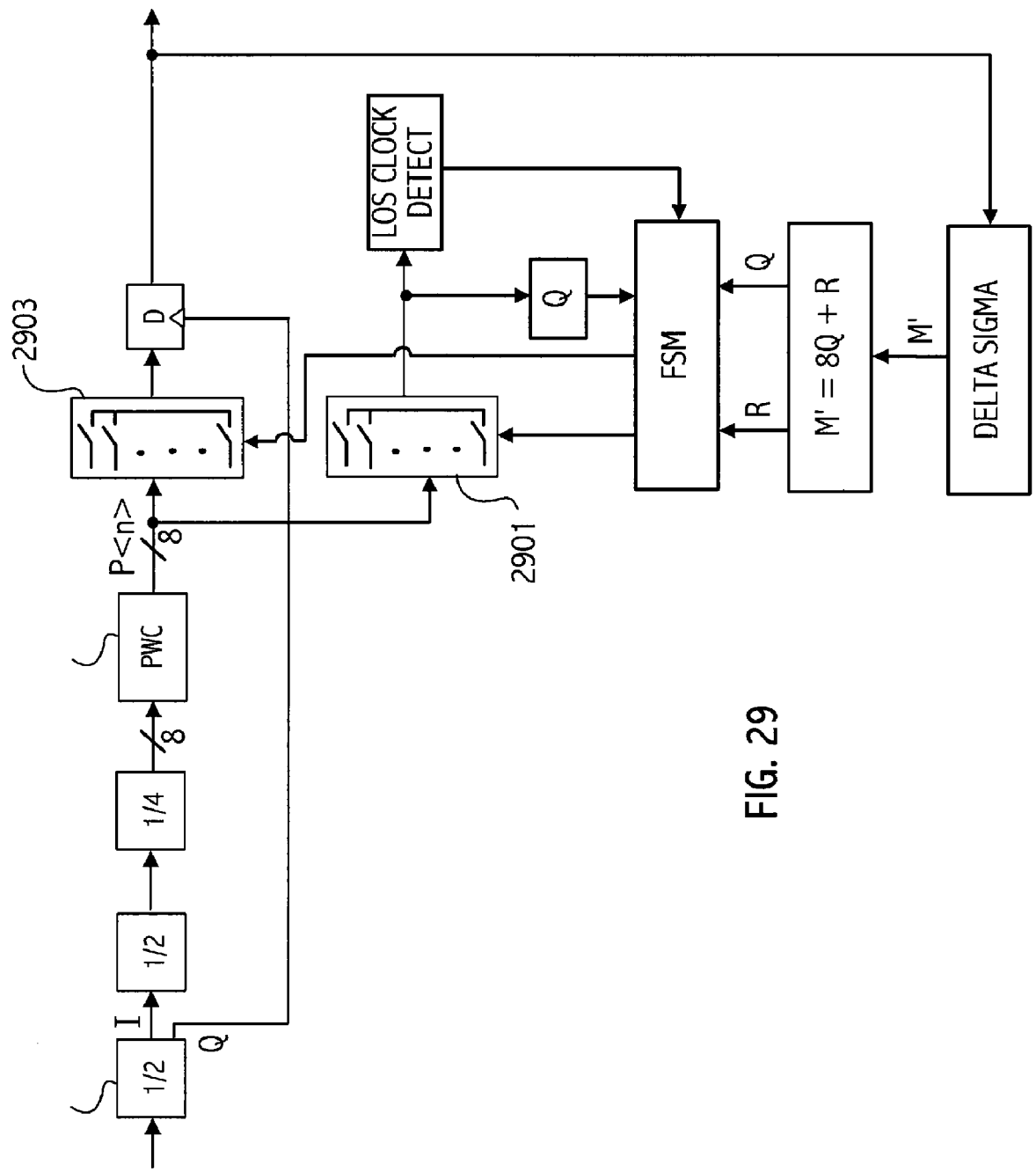
FIG. 29 illustrates an embodiment of a divider architecture that can generate a wide range of output frequencies with a specified pulse width.

Certain applications may require that the divider output waveform have a certain pulse width (e.g., an application may want the divider output waveform to have a pulse width of 800 ps for phase frequency detection (PFD) phase error cancellation (PEC)). A similar approach to the approach utilized for duty cycle correction can be used. If the desired pulse width is the same as PWC pulse width (as an alternative, the PWC pulse width be the same as desired pulse width), only two multiplexers would be needed as shown in the embodiment shown in FIG. 29. As in FIG. 27, the multiplexer 2901 is connected to Q divider, which generates the expected output frequency and used for triggering the FSM. The multiplexer 2903 periodically performs phase switching and allows the selected PWC pulse width passing through. After the pulse passes through, the multiplexer selects an input connected to ground as an OFF state. It turns on again before the next expected pulse arrives. Both sets of phase switching control signals are generated from the FSM, which includes basic FSM structures described herein.

A loss of clock detector 2905 resets the FSM when the circuit is initially powered up or when a loss of clock is detected after power-up. When the integrated circuit powers up, there is initially no output signal from multiplexer 2901. The detector sends a reset signal to the FSM to freeze the control signals (e.g., at phase <0>) to select a clock signal to pass through the multiplexer. After the detector detects the output signal from the multiplexer, it releases the reset signal and allows the FSM to operate normally. Note that the FSM that generates the clock is running on the clock that it is generating. As a result, if after power-up the FSM gets into a state where it is no longer producing clock pulses, there is no way for the FSM to recover without a chip reset. In order to allow the FSM to recover after such a failure, the loss of clock detection circuit constantly monitors the FSM clock and if loss of clock is detected, forces the FSM into a state that gets the clocks running again.

Figure 30:
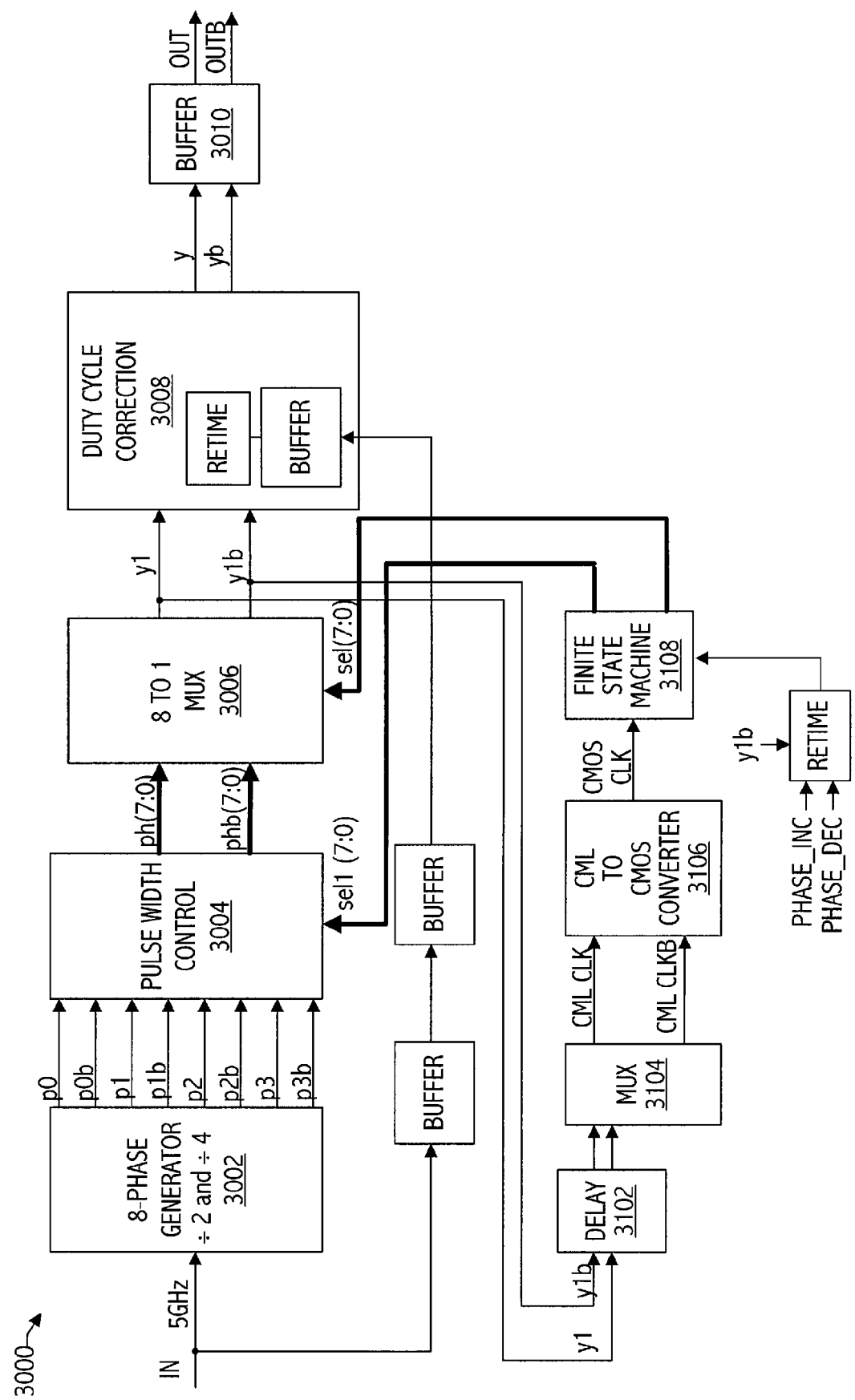
FIG. 30 illustrates a block diagram of a divider architecture including a pulse-width control block and a duty cycle correction block consistent with at least one embodiment of the invention.
Figure 31:
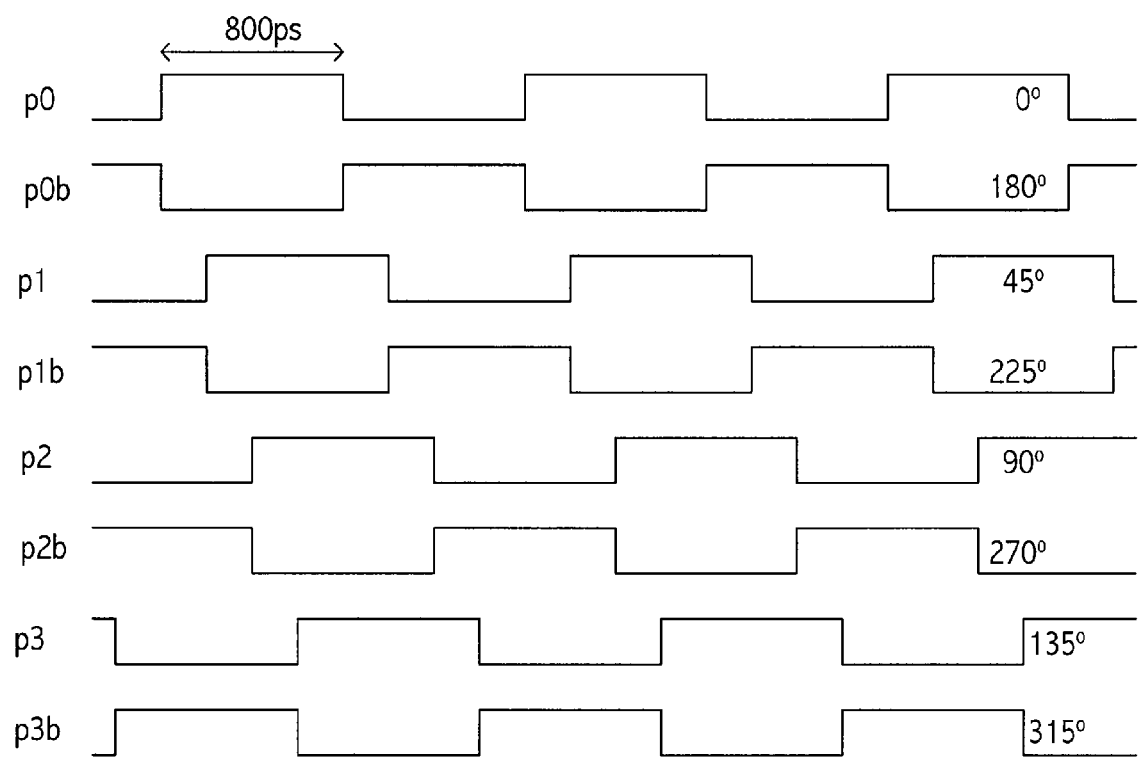
FIG. 31 illustrates a timing diagram of exemplary waveforms having different phases consistent with at least one embodiment of the invention.

Referring to FIG. 30, a programmable, high-speed divider circuit (e.g., high-speed divider 3000) according to at least one embodiment of the invention is responsive to an input clock signal (e.g., IN) having a period T. The input clock signal is provided to phase signal generator 3002, which divides the frequency of the input clock signal to a signal having a lower frequency (e.g., the input clock signal and the lower frequency signal have a frequency ratio of eight) and generates a plurality of signals having a common frequency (e.g., 625 MHz) frequency, a common duty cycle, but different phases. In at least one embodiment of high-speed divider 3000, the input clock signal has a frequency of approximately 5 GHz (i.e., T is approximately 200 ps) and has an approximately 50% duty cycle (i.e., a pulse width of approximately 100 ps), p0, p0$b$, p1, p1$b$, p2, p2$b$, p3, and p3$b$ are approximately 625 MHz, with an approximately 50% duty cycle (i.e., a pulse width of approximately 800 ps). Individual ones of p0, p0$b$, p1, p1$b$, p2, p2$b$, p3, and p3$b$ have phases separated by $\pi/4$ radians (i.e., 45°). Referring to FIG. 31, exemplary signals p0, p0$b$, p1, p1$b$, p2, p2$b$, p3, and p3$b$, are 0°, 180°, 45°, 225°, 90°, 270°, 135°, and 315° shifted from signal p0, respectively. Referring back to FIG. 30, phase signal generator 3002 supplies the multiphase signals to pulse-width control circuit 3004.

Figure 32A:
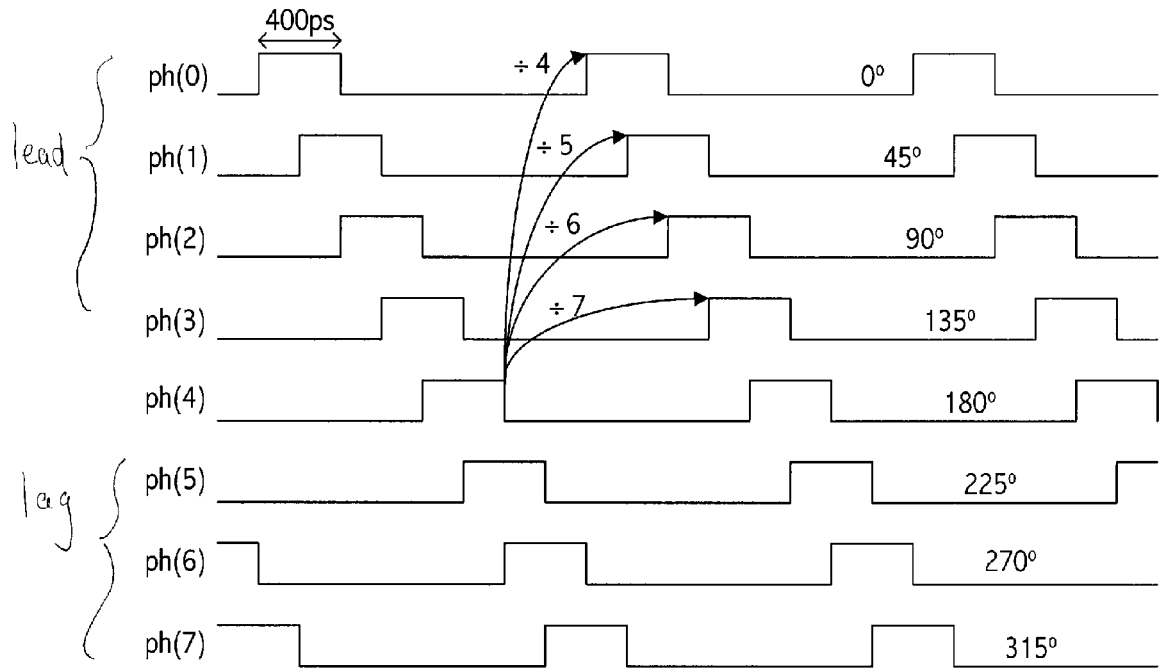
FIGS. 32A and 32B illustrate timing diagrams of exemplary waveforms illustrating operation of a pulse-width control circuit consistent with at least one embodiment of the invention.
Figure 32B:
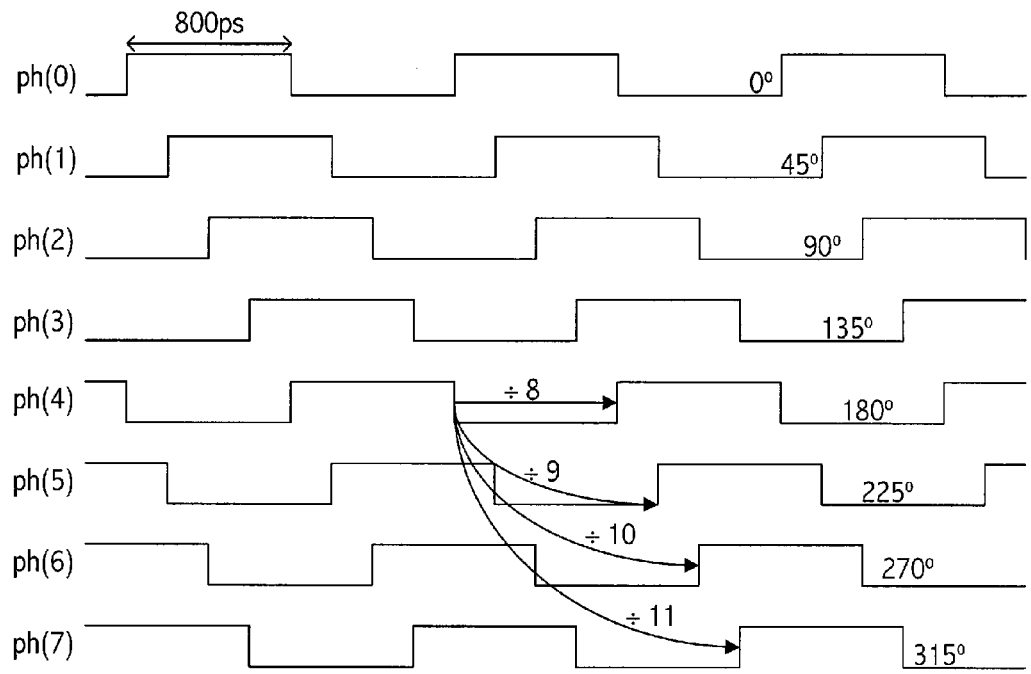

In at least one embodiment of high-speed divider 3000, pulse-width control circuit 3004 regenerates the eight multiphase signals p0, p0$b$, p1, p1$b$, p2, p2$b$, p3, and p3$b$ as signals ph(7:0) and phb(7:0), which are signals having the common frequency and pulse widths equal to either 2T or 4T, where T is the period of the input clock signal, IN. Referring to FIGS. 32A and 32B, in at least one embodiment of high-speed divider 3000, select signal sel1(7:0) controls pulse-width control circuit 3004 to generate the signals ph(7:0) and phb(7:0) having a pulse width of 2T (e.g., 400 ps) for divide ratios of 4, 5, 6, and 7. Select signal sel1(7:0) also controls pulse-width control circuit 3004 to generate the multiphase signals ph(7:0) and phb(7:0) having a pulse width of 4T (e.g., 800 ps) for divide ratios of 8, 9, 10, and 11. Although the exemplary embodiment generates signals ph(7:0) and phb(7:0) having one of two different pulse widths, additional suitable pulse widths and other divide ratios may be implemented. Note that in at least one embodiment of high-speed divider 3000, functionality of pulse-width control circuit 3004 includes at least a portion of the functionality of phase signal generator 3002 and the number of signals input to pulse-width control circuit 3004, and their common frequency may differ from the number of signals generated by pulse-width control circuit 3004 and their common frequency.

Figure 33:
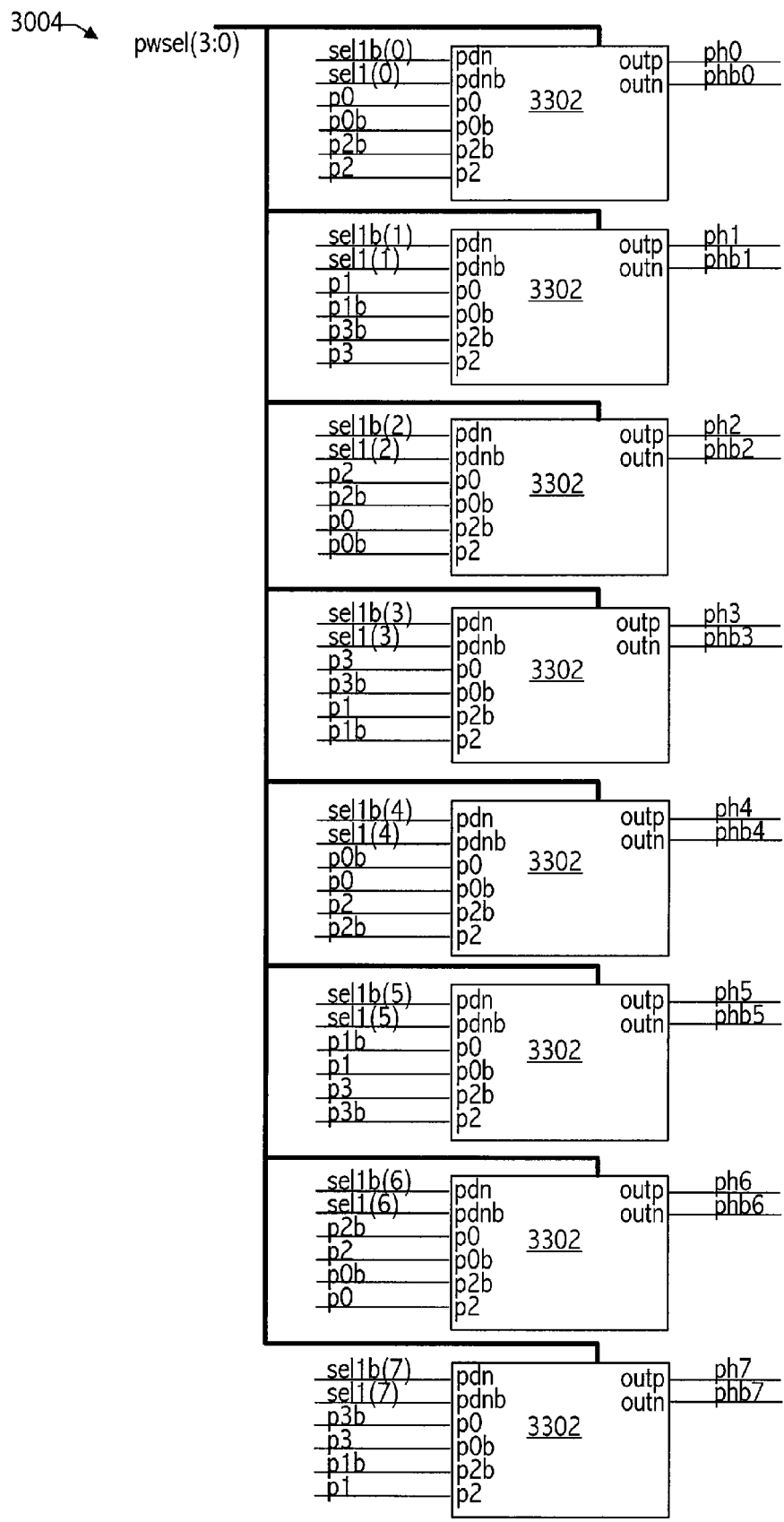
FIG. 33 illustrates a block diagram of a pulse-width control circuit consistent with at least one embodiment of the invention.

Referring to FIGS. 33 and 34, exemplary pulse-width control circuit 3004 includes individual sub-blocks 3302, which logically combine individual ones of the signals p0, p0$b$, p1, p1$b$, p2, p2$b$, p3, and p3$b$ to generate signals ph(0:7) and phb(0:7) having a selected one of two pulse widths (e.g., 400 ps or 800 ps). In at least one embodiment of pulse-width control circuit 3004, individual sub-blocks 3302 receive two input signals and their complements (e.g., p0, p0$b$, p2, and p2$b$) and exclusive-or those signals (e.g., ph(0)=p0⊕p2 and phb(0)=$\overline{p0 \oplus p2}$) to generate complementary output signals having a particular phase and a first pulse width (e.g., 400 ps). To generate complementary output signals having that same phase but with a second pulse width (e.g., 800 ps), sub-block 3302 passes an appropriate one of the multiphase input signals and its complement to the output (e.g., ph(0)=p0 and phb(0)=p0b). A control signal (e.g., pwsel(3:0)) configures individual sub-blocks 3302 for the appropriate pulse width according to a selected divide ratio (e.g., 4, 5, 6, 7, 8, 9, 10, or 11).

Figure 35:
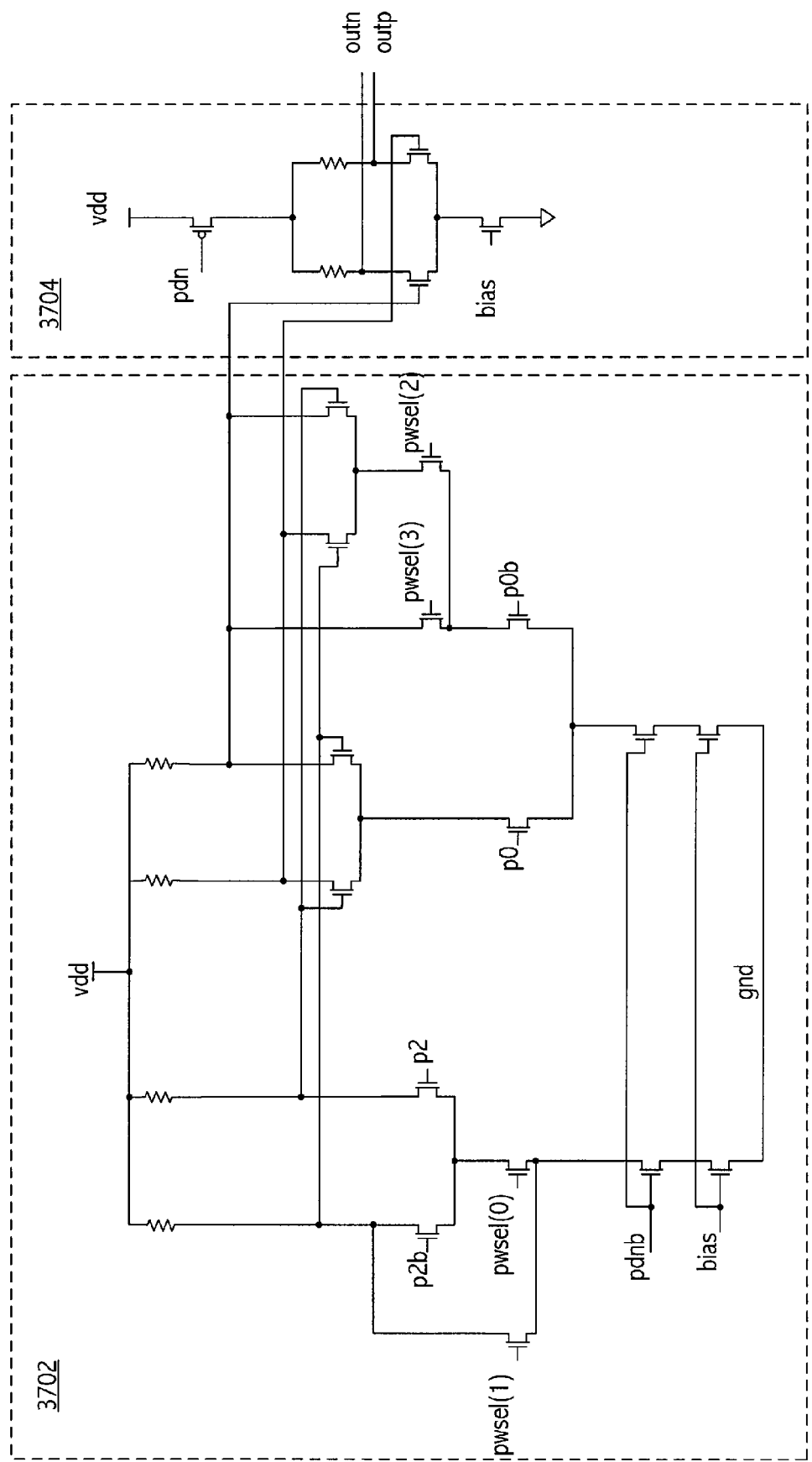
FIG. 35 illustrates a circuit diagram of an exemplary sub-block of the pulse-width control circuit of FIG. 33 consistent with at least one embodiment of the invention.

Referring to FIG. 35, an exemplary sub-block 3302 includes a current-mode logic (i.e., CML) circuit (e.g., circuit 3702) coupled to a CML buffer circuit (e.g., circuit 3704). However, in at least one embodiment of pulse-width control circuit 3004, CMOS techniques are used. In general, CML logic consumes more power than CMOS logic, but can achieve higher speeds than CMOS logic. Thus, CML logic may be more suitable than CMOS logic for high-speed designs, while CMOS logic may be preferred for lower speed designs.

Referring back to FIG. 30, pulse-width control circuit 3004 supplies signals ph(0:7) and phb(0:7) to phase selecting multiplexer 3006. Phase selecting multiplexer 3006 directs one of the eight signals received from the pulse-width control circuit 3004 to its output (e.g., y1 and y1b) according to control signal sel(7:0). By controlling which signal is directed to the output node, different frequency clock signals can be generated. Referring back to FIGS. 32A and 32B, exemplary selection of outputs of phase selecting multiplexer 3006 is illustrated. Starting with ph(4) as the output of phase selecting multiplexer 3006, ph(0) is selected as the next output of phase selecting multiplexer 3006 to generate an output signal that is the input signal divided by four. Similarly, for an output signal that is the input signal divided by 5, 6, 7, 8, 9, 10, and 11, the next output of phase selecting multiplexer 3006 should be, ph(1), ph(2), ph(3), ph(4), ph(5), ph(6), and ph(7), respectively. Although FIGS. 32A and 32B illustrate divide ratios of 4, 5, 6, 7, 8, 9, 10, and 11, other divide ratios are possible.

The control signals sel(7:0) and sel1(7:0) are generated in finite state machine 3108 based on the selected divide ratio. For a divide ratio greater than or equal to 8 (e.g., 8, 9, 10, and 11), the output of phase selecting multiplexer 3006 is switched periodically to a signal having a phase that is lagging the current output of phase selecting multiplexer 3006 by m×π/4, where "m" equals 0, 1, 2, and 3 for divide ratios 8, 9, 10 and 11, respectively. Where the indicator of the present output of phase selecting multiplexer 3006 is "n," the indicator of the next output of phase selecting multiplexer 3006 is computed by incrementing the indicator of the present output by an offset value "m" (i.e., the indicator of the next output equals "n+m"). For a divide ratio less than 8 (e.g., 4, 5, 6, and 7), the output of phase selecting multiplexer 3006 is switched periodically to a signal having a phase that is leading the current output of phase selecting multiplexer 3006 by m×π/4, where "m" equals 0, 1, 2, and 3 for divide ratios 7, 6, 5 and 4, respectively. Where the indicator of the present output of phase selecting multiplexer 3006 is "n," the indicator of the next output of phase selecting multiplexer 3006 is computed by decrementing the indicator of the present output of phase selecting multiplexer 3006 by "m" (i.e., the indicator of the next output equals "n−m"). In general, to have the next pulse of the output signal of phase selecting multiplexer 3006 occur after T (i.e., one high-speed clock cycle, e.g., 200 ps), the indicator of the output of phase selecting multiplexer 3006 is incremented (or decremented) by one (i.e., the indicator of the next output equals "n+1" or "n−1").

Referring back to FIG. 30, in at least one embodiment of high-speed divider circuit 3000, the output of phase selecting multiplexer 3006 is used to trigger finite state machine 3108. The output of phase selecting multiplexer 3006 is converted (e.g., using delay circuit 3102, select circuit 3104, and CML-to-CMOS converter circuit 3106) to a CMOS clock signal (e.g., CMOS_CLK), which is an inverted and delayed version of the signal on y1 and y1b. Thus, state elements within finite state machine 3108 are triggered off of the falling edge of the output of phase selecting multiplexer 3006 (i.e., the signal on y1 and y1b). At the next rising edge of CMOS_CLK, sel(7:0) transitions to change the currently selected multiphase signal as the output of finite state machine 3108.

Finite state machine 3108 implements a phase selecting multiplexer control algorithm to generate control signals sel (7:0) and sel1(7:0). Referring to FIGS. 36-38, an exemplary finite state machine 3108 is illustrated. Note that in at least one embodiment of state machine 3108, state elements 3204, 3206, 3210, and 3212 include at least one dynamic flip-flop, which trades off increased power for reduced delay. The value for "b" is generated according to phase increment and phase decrement signals based on external or user input, e.g., b='001' for an increment, b='111' for a decrement, and b='000' as a default value. The value of m(2:0) is a three-bit, two's complement value indicating the number of π/4 phase shifts a current waveform is to be incremented or decremented. The next phase is generated based on the present phase and an increment value as follows:

$$n(t_i+1)=n(t_i)+n_2(t_i)$$

$$n_2(t_i)=m(t_{i-1})+b(t_{i-1}).$$

In at least one embodiment of finite state machine 3108, the value of n is decoded from three bits to eight bits (e.g., using 3-bit decoder 3208) to generate the phase selecting multiplexer control signal, sel(7:0).

In addition to generating the phase selecting multiplexer control signal sel(7:0), in at least one embodiment, finite state machine 3108 generates control signal sel1(7:0). This control signal is coupled to pulse-width control circuit 3004 to selectively configure as powered-on and powered-off appropriate ones of the sub-blocks 3302 of FIG. 33. For example, finite state machine 3108 of FIG. 36 generates sel1(7:0) to configure as powered-on a sub-block 3302 corresponding to a current one of the signals ph(7:0) that is being selected by phase selecting multiplexer 3006. In addition, finite state machine 3108 of FIG. 36 also configures as powered-on a sub-block 3302 that corresponds to a next one of the signals ph(7:0) to be selected by phase selecting multiplexer 3006. All of the sub-blocks 3302 corresponding to other ones of the signals ph(7:0) are configured as powered-off. Note that when a particular one of sel(7:0) is active for one cycle as indicating the currently selected one of signals ph(7:0), a corresponding one of sel1(7:0) will be active for two cycles as indicating the next one and then the current one of signals ph(7:0) to be selected by phase selecting multiplexer 3006 as its output.

However, in at least one embodiment of high-speed divider 3000, sel(7:0) and sel1(7:0) are effectively the same signal and only one of sub-blocks 3302 (i.e., the sub-block 3302 corresponding to a current one of the signals ph(7:0) that is being selected as the output of phase selecting multiplexer 3006) is configured as powered-on and all others of sub-blocks 3302 are configured as powered-off. Accordingly, pulse-width control circuit 3004 may save substantial amounts of power by configuring as powered-off at least one of the sub-blocks 3302 at a given time (e.g., at most two of sub-blocks 3302 are powered-on at the same time). Referring to FIGS. 33 and 35, sel1(7:0) (and its complement, sel1b(7: 0)) are coupled to respective power-down terminals (e.g., pdn and pdnb nodes) of corresponding ones of the sub-blocks 3302 to selectively configure the sub-blocks (e.g., the circuits 3702 and 3704) consistent with this power-savings technique.

Figure 39:
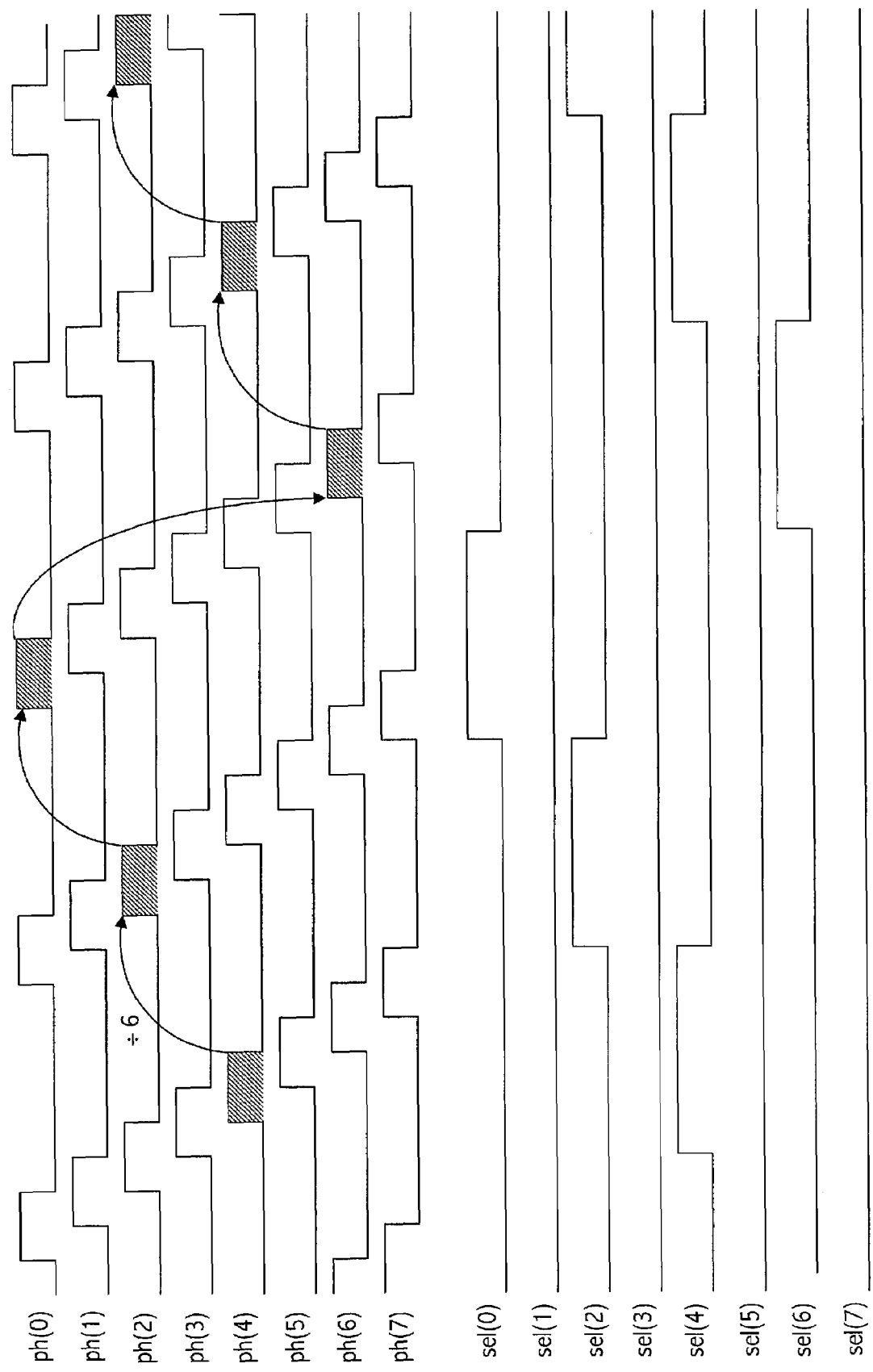
FIG. 39 illustrates a timing diagram of exemplary control signals and signals used to generate an output of the phase selecting multiplexer of FIG. 30.
Figure 40:
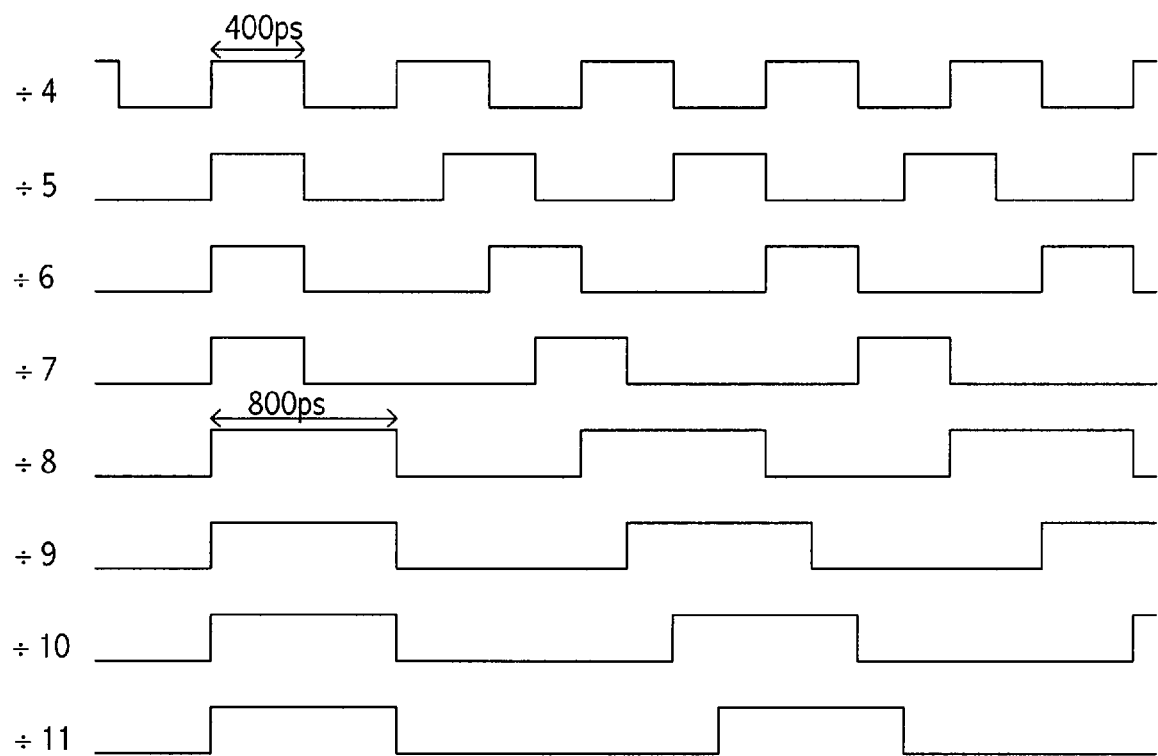
FIG. 40 illustrates a timing diagram of exemplary output signals of the phase selecting multiplexer of FIG. 30.

Exemplary waveforms for control signal sel(7:0) configured to select signals from ph(7:0) as the output waveform of phase selecting multiplexer 3006 for a divide-by-six are illustrated in FIG. 39. Note that the output waveform formed by sequentially selecting respective pulses ph(4), ph(2), ph(0), and ph(6) as the output of phase selecting multiplexer 3006 results in a waveform having less than a 50% duty cycle. FIG. 40 illustrates the resulting divided waveforms at the output of phase selecting multiplexer 3006 for divide ratios of 4, 5, 6, 7, 8, 9, 10, and 11. Only the waveforms resulting from divide-by-four and divide-by-eight have the target 50% duty cycle. Accordingly, the output of phase selecting multiplexer 3006 is supplied to duty cycle correction block 3008, which applies an adjustment to the duty cycle based on the divide ratio to achieve a substantially 50% duty cycle for the output clock signal on y and yb. In at least one embodiment of high-speed divider 3000, buffer 3010 is included to drive the output signal at an appropriate level to other circuits responsive to the lower frequency output signal.

Figures 41, 42:
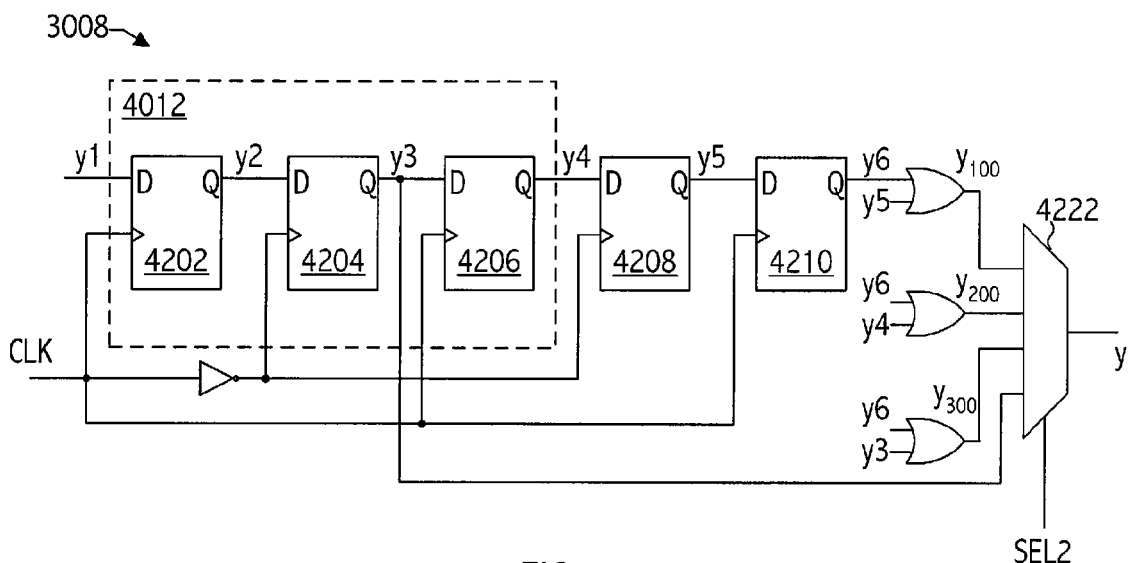
FIG. 41 illustrates exemplary values of pulse width and duty cycle corrections for different divide ratios consistent with at least one embodiment of the invention.
FIG. 42 illustrates a circuit diagram of a portion of an exemplary duty cycle correction block consistent with at least one embodiment of the invention.

Although techniques described above with reference to FIGS. 7, 8, and 27 may be used to implement phase selecting multiplexer 3006 and duty cycle correction block 3008, another technique for achieving a target duty cycle triggers state elements using only a single edge of the clock signal (e.g., rising edge or falling edge), which may relax timing requirements. Referring to FIG. 41, in at least one embodiment of high-speed divider 3000, a duty cycle correction factor is added to the output waveform to generate an output clock signal having a target duty cycle (e.g., 50%). The correction factor is determined according to the divide ratio. For example, the output of phase selecting multiplexer 3006 for a divide-by-six having a period of 1.2 ns, has a 400 ps pulse width that is adjusted by 200 ps to obtain a 50% duty cycle signal.

Referring to FIG. 42, an exemplary duty cycle correction circuit adjusts the output duty cycle using logical combinations of delayed versions of the output of phase selecting multiplexer 3006 to generate an adjusted output signal (e.g., signal y). State elements (e.g., D-latches 4202 and 4204) are included in retime circuit 4012, which reduces noise introduced into waveform by previous circuitry. Thus, signal y3 is a retimed version of the output of phase selecting multiplexer 3006. State elements (e.g., D-latches 4206, 4208, and 4210) then generate delayed versions of the output waveform that are used to adjust the duty cycle of the output waveform.

The delay of individual ones of the state elements in circuit 3008 of FIG. 42 is determined according to target amounts of pulse width adjustment (e.g., each of D-latches 4206, 4208, and 4210 introduces a 100 ps delay), which varies according to the input clock signal and the divide ratios implemented in a particular design. Logical combinations of the delayed signals result in output waveforms having a duty cycle adjusted by an appropriate amount. For example, an increase of the pulse width by 100 ps can be introduced into the output waveform by a logical-or of the retimed signal delayed by 300 ps (e.g., y6) and the retimed signal delayed by 200 ps (e.g., y5). An increase in the pulse width by 200 ps can be introduced into the output waveform by a logical-or of the retimed signal delayed by 300 ps (e.g., y6), and the retimed signal delayed by 100 ps (e.g., y4). An increase in the pulse width by 300 ps can be introduced into the output waveform by a logical-or of the retimed signal delayed by 300 ps (e.g., y6), and the retimed signal (e.g., y3). When no pulse width adjustment is needed, e.g., for a divide-by-four or a divide-by-eight, the retimed signal (e.g., y3) is delivered to the output of duty cycle correction circuit 3008. Multiplexer 4222 is controlled by control signal sel2, which selects the appropriate output waveform according to the divide ratio (e.g., consistent with the divide ratio and correction factors illustrated in FIG. 41).

Although the circuit is illustrated using single-ended signals, in at least one embodiment of duty cycle correction circuit 3008, differential signals and/or CML circuits are used. Note that the values in FIG. 41 and the circuit of FIG. 42 are exemplary only and duty cycle correction techniques described herein may be applied to other high-speed divider designs using different frequencies for the input clock signal, other divide ratios, and other target duty cycles.

Referring back to FIGS. 33-35, in at least one embodiment of high-speed divider 3000, for one or more particular divide ratios, multiplexer 3006 does not select between the signals ph(7:0) and phb(7:0) to generate the output signal (e.g., for a ratio of divide-by-four). Instead, for those divide ratio(s), pulse-width control circuit 3004 generates the output waveform by performing a logical function of (e.g., exclusive-nor) of appropriate ones of the multiphase signals (e.g., $\overline{p0 \oplus p2}$) and phase selecting multiplexer 3006 passes the signal to the output node y1 and y1b.

Thus, various embodiments of a divider circuit have been described. The description of the invention set forth herein is illustrative, and is not intended to limit the scope of the invention as set forth in the following claims. For example, while particular loop structures have been described, e.g., as illustrated in FIG. 3, various implementations of phase-locked loops, frequency locked loops, and the like are well-known to those skilled in the art, and dividers according to various embodiments of the present invention can be adapted for use in any suitable form of these or similar control loops. It should also be appreciated that a divider according to an embodiment of the present invention is not limited to use in phase-locked loops, frequency locked loops, or the like but can be incorporated into, or used in conjunction with, any suitable circuit, device, or application in which an input signal is to be frequency divided. Other variations and modifications of the embodiments disclosed herein, may be made based on the description set forth herein, without departing from the scope and spirit of the invention as set forth in the following claims.

What is claimed is:

1. A method for dividing a first signal having a first frequency by a divide ratio to generate a lower frequency signal comprising:

generating a first plurality of signals having a common frequency, a first pulse width, and different phases, the first plurality of signals being based, at least in part, on at least one signal having a second pulse width, the first pulse width being selected from a plurality of pulse widths based, at least in part, on the divide ratio; and sequentially selecting individual pulses of the first plurality of signals as an output signal of a select circuit to generate an output signal having a frequency lower than the first frequency.

2. The method, as recited in claim 1, wherein the at least one signal is one of a second plurality of signals and further comprising:

providing the second plurality of signals having a second common frequency, the second pulse width, and different phases, the second common frequency being lower than the first frequency.

3. The method, as recited in claim 2, wherein the first and second common frequencies are different.

4. The method, as recited in claim 1, wherein the first and second pulse widths are different.

5. The method, as recited in claim 1, further comprising:

adjusting the second pulse width of the select circuit output signal based at least in part on the divide ratio and providing the adjusted signal as the lower frequency output signal having a third pulse width.

6. The method, as recited in claim 1, wherein the second pulse width is different from the third pulse width and the third pulse width corresponds to a 50% duty cycle.

7. The method, as recited in claim 5, wherein the adjusting comprises:
sequentially selecting, substantially simultaneously with the generation of the select circuit output signal, individual pulses of the first plurality of signals as an output of a second select circuit, the second select circuit output signal having the same frequency as the select circuit output signal and a phase different from the select circuit output signal; and
generating the output signal based at least in part on the first select circuit output signal and the second select circuit output signal.

8. The method, as recited in claim 7, wherein the adjusting further comprises:
generating the output signal having a rising edge based on one of the select circuit output signal and the second select circuit output signal and having a falling edge based on the other of the select circuit output signal and the second select circuit output signal, thereby determining a duty cycle of the output signal.

9. The method, as recited in claim 5, wherein the adjusting further comprises:
delaying a version of the select circuit output signal to generate at least one delayed version of the select circuit output signal; and
providing as the output signal a selected one of the version of the select circuit output signal and at least one adjusted version of the select circuit output signal, the at least one adjusted version of the select circuit output signal having a pulse width different from the version of the select circuit output signal and being based at least in part on the at least one delayed version of the select circuit output signal.

10. The method, as recited in claim 9, wherein the adjusting further comprises:
logically combining the at least one delayed version of the select circuit output signal and another version of the select circuit output signal to generate the at least one adjusted version of the select circuit output signal.

11. The method, as recited in claim 1, wherein the sequential selection comprises:
selecting a first of the first plurality of signals as the select circuit output signal;
summing at least a first value corresponding to the first phase, with a second value corresponding to a phase offset from the first phase, and generating a sum indicative thereof; and
selecting a second one of the first plurality of signals having a second phase as the select circuit output signal to generate the output signal.

12. The method, as recited in claim 11, wherein the common frequency is lower than the first frequency and the output signal has a higher frequency than the common frequency.

13. An apparatus for dividing a first signal having a first frequency by a divide ratio to generate a lower frequency signal comprising:
a pulse-width control circuit responsive to at least one signal having a first pulse width and configured to generate a first plurality of signals having a common frequency, a second pulse width based, at least in part, on the divide ratio, and respective ones of different phases; and
a select circuit configured to receive the first plurality of signals and to supply a first selected signal of the first plurality of signals as a select circuit output signal according to a select signal.

14. The apparatus, as recited in claim 13, wherein the at least one signal is one of a second plurality of signals and further comprising:
at least one divider circuit coupled to the pulse-width control circuit and configured to generate the second plurality of signals having a second common frequency, a second pulse width, and respective ones of different phases based, at least in part, on the first signal.

15. The apparatus, as recited in claim 13, further comprising:
a duty-cycle correction circuit configured to receive the select circuit output signal and adjust the second pulse width of the select circuit output signal based at least in part on the divide ratio to generate an output signal having a frequency lower than the first frequency and having a third pulse width.

16. The apparatus, as recited in claim 13, wherein the first and second pulse widths are different.

17. The apparatus, as recited in claim 15, wherein the first and second pulse widths are the same.

18. The apparatus, as recited in claim 15, wherein the second pulse width is different from the third pulse width and the third pulse width corresponds to a 50% duty cycle.

19. The apparatus, as recited in claim 15, wherein the duty cycle correction circuit comprises:
at least one additional select circuit configured to receive the first plurality of signals and to supply at least a second selected signal of the first plurality of signals as a second select circuit output signal according to at least a second select signal; and
a combiner circuit configured to generate an output signal based at least in part on the select circuit output signal and the second select circuit output signal, the output signal having a frequency lower than the first frequency.

20. The apparatus, as recited in claim 15, wherein the duty cycle correction circuit comprises:
at least one delay element configured to delay a version of the select circuit output signal to generate at least one delayed version of the select circuit output signal; and
a second select circuit configured to provide as the output signal a selected one of the version of select circuit output signal and the at least one adjusted version of the select circuit output signal, the at least one adjusted version of the select circuit output signal having a pulse width greater than the version of the select circuit output signal and being based at least in part on the at least one delayed version of the select circuit output signal.

21. The apparatus, as recited in claim 20, wherein the at least one delay element includes a plurality of series coupled current mode logic (CML) D-latches.

22. The apparatus, as recited in claim 15, wherein the common frequency is lower than the first frequency and the output signal has a higher frequency than the common frequency.

23. The apparatus, as recited in claim 14, wherein the first plurality of signals and the second plurality of signals include different numbers of signals having the common frequency.

24. An apparatus for dividing a first signal having a first frequency by a divide ratio to generate a lower frequency signal comprising:
means for generating a first plurality of signals having a common frequency, a first pulse width, and different phases, the first plurality of signals being based, at least in part, on at least one signal having a second pulse width, the first pulse width being selected from a plurality of pulse widths based, at least in part, on the divide ratio; and means for sequentially selecting individual pulses of the first plurality of signals as an output signal of the sequentially selecting means to generate an output signal having a frequency lower than the first frequency.

25. The apparatus, as recited in claim 24, wherein the at least one signal is one of a second plurality of signals and further comprising:

means for providing the second plurality of signals to the means for generating, the second plurality of signals having a second common frequency, a second pulse width, and different phases, the second common frequency being lower than the first frequency.

26. The apparatus, as recited in claim 25, wherein the first and second common frequencies are different.

27. The apparatus, as recited in claim 24, further comprising:

means for adjusting the first pulse width of the sequentially selecting means output signal based at least in part on the divide ratio and providing the adjusted signal having a third pulse width as the output signal.

28. The apparatus, as recited in claim 27, wherein the means for adjusting comprises:

a second means for sequentially selecting individual pulses of the first plurality of signals as an output signal of the second sequentially selecting means having a phase different from the sequentially selecting means output signal; and means for generating the output signal based at least in part on edges of the sequentially selecting means output signal and the second sequentially selecting means output signal, thereby determining a duty cycle of the output signal.

29. The apparatus, as recited in claim 27, wherein the means for adjusting comprises:

means for delaying a version of the sequentially selecting means output signal to generate at least one delayed version of the sequentially selecting means output signal; and means for providing as the output signal a selected one of the version of the sequentially selecting means output signal and at least one adjusted version of the sequentially selecting means output signal, the at least one adjusted version of the sequentially selecting means output signal having a pulse width different from the version of the sequentially selecting means output signal and being based at least in part on the at least one delayed version of the sequentially selecting means output signal.

* * * * *